United States Patent
Kurafuchi et al.

(10) Patent No.: US 9,661,763 B2
(45) Date of Patent: May 23, 2017

(54) STRUCTURE CONTAINING CONDUCTOR CIRCUIT, METHOD FOR MANUFACTURING SAME, AND HEAT-CURABLE RESIN COMPOSITION

(71) Applicant: HITACHI CHEMICAL COMPANY, LTD., Chiyoda-ku, Tokyo (JP)

(72) Inventors: Kazuhiko Kurafuchi, Tsukuba (JP); Daisuke Fujimoto, Chikusei (JP); Kunpei Yamada, Chikusei (JP); Toshimasa Nagoshi, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 66 days.

(21) Appl. No.: 14/351,150

(22) PCT Filed: Oct. 9, 2012

(86) PCT No.: PCT/JP2012/076130
§ 371 (c)(1),
(2) Date: Apr. 11, 2014

(87) PCT Pub. No.: WO2013/054790
PCT Pub. Date: Apr. 18, 2013

(65) Prior Publication Data
US 2014/0251676 A1    Sep. 11, 2014

(30) Foreign Application Priority Data
Oct. 11, 2011   (JP) .................................. 2011-224341

(51) Int. Cl.
G03F 7/20 (2006.01)
H05K 3/46 (2006.01)
H05K 1/03 (2006.01)
H05K 3/10 (2006.01)

(52) U.S. Cl.
CPC ............. *H05K 3/4697* (2013.01); *H05K 1/03* (2013.01); *H05K 3/4673* (2013.01); *H05K 3/108* (2013.01); *H05K 2203/0582* (2013.01); *Y10T 29/49162* (2015.01)

(58) Field of Classification Search
USPC ....................................................... 430/311
See application file for complete search history.

(56) References Cited

U.S. PATENT DOCUMENTS

| | | | | |
|---|---|---|---|---|
| 2004/0122208 A1* | 6/2004 | Okada | ................. | C08G 59/681 528/408 |
| 2009/0321387 A1* | 12/2009 | Kang | ................. | H05K 3/0035 216/13 |
| 2010/0224391 A1* | 9/2010 | Tamura | ................. | G03F 1/144 174/250 |
| 2011/0198114 A1* | 8/2011 | Maeda | ............. | H01L 23/49811 174/257 |

FOREIGN PATENT DOCUMENTS

| | | |
|---|---|---|
| CN | 101286454 A | 10/2008 |
| JP | 01-307293 | 12/1989 |
| JP | 08-279678 | 10/1996 |
| JP | 11-054913 | 2/1999 |
| JP | 11-274727 | 10/1999 |
| JP | 2000-101244 | 4/2000 |
| JP | 2001-217543 | 8/2001 |
| JP | 2003-017848 | 1/2003 |
| JP | 2003-163323 | 6/2003 |
| JP | 2008-306227 | 12/2008 |
| JP | 2010-016336 | 1/2010 |
| JP | 2011-018830 | 1/2011 |
| TW | 540284 B | 7/2003 |
| TW | 200804991 A | 1/2008 |
| WO | WO 2010/101163 A1 | 9/2010 |

OTHER PUBLICATIONS

Office Action in counterpart CN Patent Application No. 201280050024.7 dated Mar. 24, 2016.
International Search Report of Appln. No. PCT/JP2012/076130 dated Dec. 25, 2012 in English.
International Preliminary Report on Patentability of Appln. No. PCT/JP2012/076130 dated Apr. 24, 2014 in English.
Office Action in counterpart TW Application No. 101137326 dated Apr. 8, 2016.

* cited by examiner

*Primary Examiner* — Daborah Chacko Davis
(74) *Attorney, Agent, or Firm* — Fitch, Even, Tabin & Flannery, LLP

(57) ABSTRACT

A method for manufacturing a structure containing a conductor circuit according to the present invention can provide openings in various shapes by patterning a first photosensitive resin layer in a first patterning process according to shapes of openings formed in a heat-curable resin layer. Further, in the method for manufacturing a structure containing a conductor circuit, a plurality of openings can be formed at the same time and a residue of the resin around the opening can be reduced, unlike a case in which openings are formed with a laser. Therefore, it is possible to sufficiently efficiently manufacture the structure having excellent reliability even when the number of pins of a semiconductor element increases and it is necessary to provide a great number of fine openings.

24 Claims, 14 Drawing Sheets

STRUCTURE CONTAINING CONDUCTOR CIRCUIT, METHOD FOR MANUFACTURING SAME, AND HEAT-CURABLE RESIN COMPOSITION

TECHNICAL FIELD

The present invention relates to a structure containing a conductor circuit, a method for manufacturing the same, and a heat-curable resin composition.

BACKGROUND ART

A printed wiring board, which is a structure containing a conductor circuit, is a printed wiring board in which a plurality of wiring layers are formed on a core board, and includes a copper-clad laminate which is the core board, an interlayer insulating material provided between the respective wiring layers, and a solder-resist provided on the topmost surface. Semiconductor elements are usually mounted on the printed wiring board through a die bonding material or an underfill material. Further, they may be entirely sealed by a transfer sealant, or a metal cap (cover) for improving heat dissipation may be mounted, as necessary. In recent years, reductions in size and weight of semiconductor devices have continuously progressed, and densification of semiconductor elements and multilayer printed wiring boards has also progressed. Further, a mounting form such as package on package in which a semiconductor device is stacked on a semiconductor device is also widely implemented, and a mounting density of the semiconductor device is expected to increase more in the future.

Incidentally, it is necessary for vias (openings) for electrically connecting upper and lower wiring layers to be provided in an interlayer insulating material of a printed wiring board. If the number of pins of a flip chip mounted on the printed wiring board increases, it is necessary to provide openings corresponding to the number of pins. However, since a conventional printed wiring board has low mounting density and has a design in which a mounted semiconductor element has from several thousand pins to about ten thousand pins, it is not necessary to provide openings with a small diameter and a small pitch.

However, as miniaturization of the semiconductor element progresses and the number of pins increases from tens of thousands to hundreds of thousands, there is an increasing need for reduction in sizes of openings formed in the interlayer insulating material of the printed wiring board according to the number of pins of the semiconductor element. In recent years, a printed wiring board in which openings are provided by a laser has been developed using a heat-curable resin material (e.g., see Patent Literatures 1 to 4).

CITATION LIST

Patent Literature

[Patent Literature 1] Japanese Patent Application Laid-Open No. H08-279678
[Patent Literature 2] Japanese Patent Application Laid-Open No. H11-054913
[Patent Literature 3] Japanese Patent Application Laid-Open No. 2001-217543
[Patent Literature 4] Japanese Patent Application Laid-Open No. 2003-017848

SUMMARY OF INVENTION

Technical Problem

In printed wiring boards described in Patent Literatures 1 to 4, openings are provided by a laser using a heat-curable resin material.

FIG. 12 is a diagram illustrating a conventional method for manufacturing a multilayer printed wiring board. A multilayer printed wiring board 100A illustrated in FIG. 12(f) includes wiring patterns in a surface and the inside of the multilayer printed wiring board. The multilayer printed wiring board 100A is obtained by stacking a copper-clad laminate, an interlayer insulating material, a metal foil and the like and appropriately forming the wiring patterns using an etching method or a semi-additive method.

First, the interlayer insulating layer 103 is formed on both surfaces of the copper-clad laminate 101 having a wiring pattern 102 provided on a surface (see FIG. 12(a)). For the interlayer insulating layer 103, a heat-curable resin composition may be printed using a screen printer or a roll coater, or a film including a heat-curable resin composition may be prepared in advance and pasted on the surface of the printed wiring board using a laminator. Then, at a place at which an electrical connection to the outside is necessary, an opening 104 is formed using a YAG laser or a carbon dioxide laser and a smear (residue) around the opening 104 is removed through a desmearing process (see FIG. 12(b)). Then, a seed layer 105 is formed using an electroless plating method (see FIG. 12(c)). A photosensitive resin composition is laminated on the seed layer 105 and a predetermined place is exposed and developed to form a wiring pattern 106 (see FIG. 12(d)). Then, a wiring pattern 107 is formed using an electrolytic plating method, a cured material of the photosensitive resin composition is removed using a peeling solution, and the seed layer 105 is then removed through etching (see FIG. 12(e)). This process is repeatedly performed to form a solder-resist 108 on the topmost surface, such that the multilayer printed wiring board 100A can be manufactured (see FIG. 12(f)).

In the multilayer printed wiring board 100A obtained in this way, a semiconductor element can be mounted in its corresponding place and an electrical connection can be secured. However, there are problems associated with the multilayer printed wiring board 100A manufactured using such a method in that it is necessary to introduce new equipment such as a laser, it is difficult to provide a relatively large opening or a fine opening of 60 μm or less, it is necessary to use a laser according to an opening diameter, and it is difficult to provide a special shape. Further, there are problems in that time is taken when it is necessary to provide a great number of fine openings since the respective openings should be formed one by one when the openings are formed using the laser, and reliability of the obtained multilayer printed wiring board is degraded if a residue of a resin that remains around the openings is not removed.

The present invention has been made in view of the aforementioned problems, and an object of the present invention is to provide a method for sufficiently efficiently manufacturing a structure having fine openings in an insulating layer and having excellent reliability. Further, an object of the present invention is to provide a structure (e.g., a printed wiring board) containing a conductor circuit manufactured using the above method, and a heat-curable resin composition suitable for manufacturing these structures

Solution to Problem

In order to solve the above problems, a method for manufacturing a structure containing a conductor circuit according to the present invention is a method for manufacturing a structure containing a conductor circuit in which openings are provided in an insulating layer formed on a surface of a support having the conductor circuit, and a wiring portion connected to the conductor circuit is formed in the opening, and comprises a first photosensitive resin layer formation process for forming a first photosensitive resin layer on the support to cover the conductor circuit; a first patterning process for patterning the first photosensitive resin layer by performing an exposure process and a developing process on the first photosensitive resin layer; a heat-curable resin layer formation process for forming a heat-curable resin layer on the support to cover the pattern of the first photosensitive resin layer; a pattern exposure process for removing a portion of the heat-curable resin layer to expose a predetermined place of the pattern of the first photosensitive resin layer from the heat-curable resin layer; and an opening formation process for removing the first photosensitive resin layer exposed from the heat-curable resin layer to form an opening exposing the conductor circuit in the heat-curable resin layer.

In this method for manufacturing a structure containing a conductor circuit, various openings can be easily formed by patterning the first photosensitive resin layer in the first patterning process according to a shape of the opening formed in the heat-curable resin layer. Further, in this method for manufacturing a printed wiring board, it is possible to form a plurality of openings at the same time and reduce the residue of the resin around the opening, unlike a case in which openings are formed with a laser. Therefore, it is possible to efficiently manufacture a printed wiring board having excellent reliability even when the number of pins of the semiconductor element increases and it is necessary to provide a great number of fine openings.

Further, it is preferable for the method to further comprise a heat-curing process for heat-curing the heat-curable resin layer as a process immediately after the heat-curable resin layer formation process, and for the pattern exposure process and the opening formation process to include performing removal of a portion of the heat-curable resin layer after the heat curing and removal of the first photosensitive resin layer exposed from the heat-curable resin layer by performing plasma processing and a desmearing process. In this case, it is possible to promptly expose the first photosensitive resin layer through plasma processing and the desmearing process and to reduce the residue around the opening more reliably.

Further, it is preferable for the method to further comprise a heat-curing process for heat-curing the heat-curable resin layer as a process immediately after the heat-curable resin layer formation process, and for the pattern exposure process and the opening formation process to include performing removal of a portion of the heat-curable resin layer and removal of the first photosensitive resin layer exposed from the heat-curable resin layer by performing a desmearing process. In this case, it is possible to promptly expose the first photosensitive resin layer through the desmearing process and to reduce the residue around the opening more reliably.

Further, it is preferable for the method to further comprise a heat-curing process for heat-curing the heat-curable resin layer as a process immediately after the heat-curable resin layer formation process, for the pattern exposure process to include performing removal of a portion of the heat-curable resin layer after the heat curing by performing a polishing process, and for the opening formation process to include performing removal of the first photosensitive resin layer exposed from the heat-curable resin layer by performing the desmearing process. In this case, it is possible to promptly expose the first photosensitive resin layer through the polishing process or the desmearing process and to more reliably reduce the residue around the opening through the desmearing process.

Further, it is preferable for the method to further comprise a heat-curing process for heat-curing the heat-curable resin layer as a process immediately after the heat-curable resin layer formation process, and for the pattern exposure process and the opening formation process to include performing removal of a portion of the heat-curable resin layer after the heat curing and removal of the first photosensitive resin layer exposed from the heat-curable resin layer by performing plasma processing. In this case, it is possible to promptly expose the first photosensitive resin layer through the plasma processing and to more reliably reduce the residue around the opening through the desmearing process.

Further, it is preferable for the method to further comprise a heat-curing process for heat-curing the heat-curable resin layer as a process between the pattern exposure process and the opening formation process, for the pattern exposure process to include removing a portion of the heat-curable resin layer before the heat curing by performing plasma processing, and for the opening formation process to include performing removal of the first photosensitive resin layer exposed from the heat-curable resin layer after the heat curing by performing plasma processing. In this case, it is possible to promptly expose the first photosensitive resin layer through the plasma processing and to more reliably reduce the residue around the opening.

It is preferable for the pattern exposure process and the opening formation process to include performing removal of a portion of the heat-curable resin layer before the heat curing and removal of the first photosensitive resin layer exposed from the heat-curable resin layer by performing plasma processing, and for the method to further comprise a heat-curing process for heat-curing the heat-curable resin layer as a process after the opening formation process. In this case, it is possible to promptly expose the first photosensitive resin layer through the plasma processing and to more reliably reduce the residue around the opening.

Further, it is preferable for the temperature of the heat-curable resin layer to range from 150° C. to 250° C. and for a heating time to range from 30 minutes to 300 minutes in the heat-curing process. When the temperature of the heat-curable resin layer is 150° C. or more and the heating time is 30 minutes or more, the heat-curable resin layer can be sufficiently cured, and therefore it is easy to remove the heat-curable resin layer and to expose the conductor circuit in the subsequent pattern exposure and opening formation processes. On the other hand, when the temperature of the heat-curable resin layer is 250° C. or less and the heating time is 300 minutes or less, it is possible to suppress oxidation of the copper of the conductor circuit surface and to prevent the heat-curable resin layer from being peeled in a copper interface.

Further, it is preferable for the heat-curing process to include performing heat curing in an atmosphere of an inert gas. It is possible to suppress oxidation of the copper of the conductor circuit surface in the heat-curing process by performing heat-curing in the atmosphere of the inert gas.

Further, it is preferable for the method to further comprise a seed layer formation process for forming a seed layer which is a base of the wiring portion using an electroless plating method to cover at least a portion of the heat-curable resin layer after the opening is formed; a second patterning process for forming a second photosensitive resin layer to cover the seed layer and then performing an exposure process and a developing process on the second photosensitive resin layer to pattern the second photosensitive resin layer; a wiring portion patterning process for forming the wiring portion using an electrolytic plating method to at least cover the seed layer and then peeling a pattern of the second photosensitive resin layer using a peeling process to pattern the wiring portion; and a seed layer removal process for removing the seed layer in an area in which the wiring portion is not formed. It is possible to form the wiring portion using the electrolytic plating method and to selectively pattern the wiring portion by forming the seed layer.

Further, it is preferable for a thickness $T_1$ of the first photosensitive resin layer to range from 2 µm to 50 µm in the first photosensitive resin layer formation process. When the thickness $T_1$ of the first photosensitive resin layer is 2 µm or more, a film of a photosensitive resin composition used for formation of the first photosensitive resin layer is easily formed, and therefore it is possible to easily prepare a film-shaped photosensitive resin composition used for manufacture of the printed wiring board. When the thickness $T_1$ of the first photosensitive resin layer is 50 µm or less, it is easy for a fine pattern to be formed in the first photosensitive resin layer.

Further, it is preferable for a thickness $T_2$ of the heat-curable resin layer to range from 2 µm to 50 µm in the heat-curable resin layer formation process. When the thickness $T_2$ of the heat-curable resin layer is 2 µm or more, a film of a heat-curable resin composition used for formation of the heat-curable resin layer is easily formed, and therefore it is possible to easily prepare a film-shaped heat-curable resin composition used for manufacture of the printed wiring board. When the thickness $T_2$ of the heat-curable resin layer is 50 µm or less, it is easy for a fine pattern to be formed in the heat-curable resin layer.

Further, it is preferable for a ratio $(T_2/T_1)$ of a thickness $T_2$ of the heat-curable resin layer to a thickness $T_1$ of the first photosensitive resin layer to range from 1.0 to 2.0 in the heat-curable resin layer formation process. When $(T_2/T_1)$ is 1.0 or more, a pattern of the first photosensitive resin layer is easily buried with a heat-curable resin composition in the heat-curable resin layer formation process, and therefore it is possible to further increase reliability of the obtained structure having the conductor circuit. On the other hand, when $(T_2/T_1)$ is 2.0 or less, the heat-curable resin layer is easily removed in a subsequent process and openings can be formed in the heat-curable resin layer within a short time, and therefore it is possible to manufacture the structure containing a conductor circuit more efficiently.

Further, it is preferable for a ratio $(D/R_{min})$ of a depth D of the opening to a smallest diameter $R_{min}$ among the openings formed in the heat-curable resin layer to range from 0.1 to 1.0 in the opening formation process. When $(D/R_{min})$ is 0.1 or more, the heat-curable resin layer is not too thin, and therefore a shape of the opening can be stably held even when a fine opening is formed in the heat-curable resin layer. On the other hand, when $(D/R_{min})$ is 1.0 or less, the first photosensitive resin layer is easily removed and a fine opening having a diameter of 60 µm or less is more easily formed.

Further, a structure containing a conductor circuit according to the present invention is a structure containing a conductor circuit manufactured using the method for manufacturing a structure containing a conductor circuit described above, wherein a diameter of the opening included in the heat-curable resin layer is preferably 60 µm or less. The structure containing a conductor circuit manufactured by the manufacturing method described above can have fine openings in the insulating layer and have excellent reliability in comparison with the conventional structure containing a conductor circuit illustrated in FIG. 12. Further, when the diameter of the opening included in the heat-curable resin layer in the structure containing a conductor circuit is 60 µm or less, the structure is suitable for mounting of a semiconductor element including a great number of pins, i.e., tens of thousands of pins to hundreds of thousands of pins.

Further, the present invention relates to a photosensitive resin composition used for the method for manufacturing a structure containing a conductor circuit described above.

Further, the present invention relates to a dry film resist including a photosensitive resin composition used for the method for manufacturing a structure containing a conductor circuit described above.

Further, it is preferable for a structure containing a conductor circuit according to the present invention to be a heat-curable resin composition used in the method for manufacturing a structure containing a conductor circuit described above and to be a heat-curable resin composition containing a resin composition containing at least one selected from the group consisting of an epoxy resin, a phenolic resin, a cyanate ester resin, a polyamide-imide resin and a heat-curable polyimide resin; and an inorganic filler whose maximum particle size is 5 µm or less and average particle size is 1 µm or less. When the heat-curable resin layer is formed using such a heat-curable resin composition, the surface of the opening formed in the heat-curable resin layer becomes smooth and a seed layer is easily formed on the opening.

Further, the present invention relates to a heat-curable resin film including the heat-curable resin composition described above.

Advantageous Effects of Invention

According to the present invention, the structure including the conductor circuit having fine openings in the insulating layer and having excellent reliability can be manufactured sufficiently efficiently.

DESCRIPTION OF EMBODIMENTS

Figure 1:
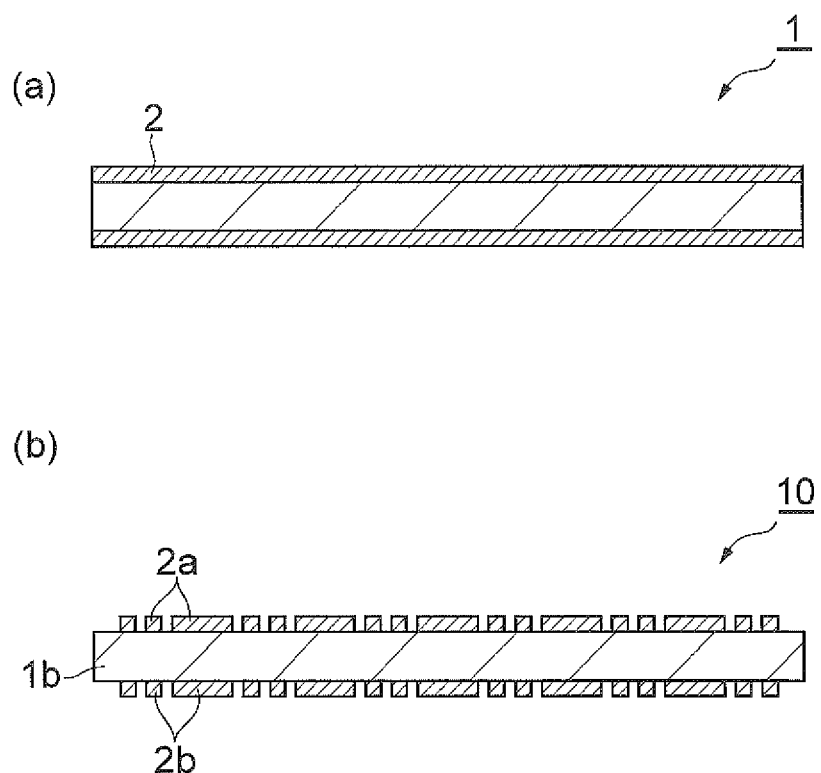
FIG. 1 is a cross-sectional view illustrating a method for manufacturing a printed wiring board according to an embodiment of the present invention.

Hereinafter, preferred embodiments of the present invention will be described in detail with reference to the drawings. In the following description, the same or similar portions are denoted with the same reference signs and repeated description is omitted. Further, positional relationships such as top, bottom, left and right are assumed to be based on positional relationships illustrated in the drawings unless otherwise mentioned. Further, dimension ratios in the drawings are not limited to illustrated ratios.

A method for manufacturing a structure containing a conductor circuit of the present invention is preferably used to manufacture the printed wiring board for mounting semiconductor elements. Particularly, the method may also be preferably used for a method of rewiring a boardless package such as a coreless board, a WLP (Wafer Level Package), or an eWLB embedded Wafer Level Ball Grid Array), in addition to manufacture of a printed wiring board for mounting a flip chip type semiconductor element. Above all, the method is particularly suitable for a printed wiring board in which a size of a mounted semiconductor element is large and which is electrically connected to tens of thousands of bumps arranged in an area array shape on a surface of the semiconductor element.

FIG. 1 is a cross-sectional view illustrating a method for manufacturing a printed wiring board according to an embodiment of the present invention. First, a copper-clad laminate 1 having a copper foil 2 on surfaces of both sides which are supports is prepared, as illustrated in FIG. 1(a). Then, unnecessary places of the copper foil 2 of the copper-clad laminate 1 are removed through etching to form conductor circuits 2a and 2b, and a printed wiring board 10 is obtained, as illustrated in FIG. 1(b). Further, the material of the circuits is not limited to copper.

Figure 2:
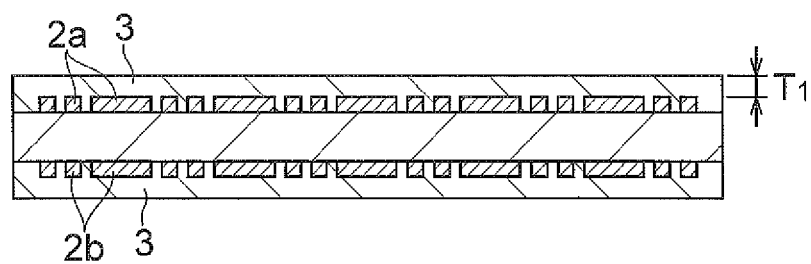
FIG. 2 is a cross-sectional view illustrating a first photosensitive resin layer formation process subsequent to FIG. 1.

Then, a first photosensitive resin layer 3 including a photosensitive resin composition, which will be described below, is formed on the printed wiring board 10 to cover the conductor circuits 2a and 2b (a first photosensitive resin layer formation process), as illustrated in FIG. 2. A thickness $T_1$ of the first photosensitive resin layer 3 is preferably 2 μm to 50 μm, and more preferably 5 μm to 30 μm. When the thickness $T_1$ of the first photosensitive resin layer is 2 μm or more, a film of the photosensitive resin composition to be used for formation of the first photosensitive resin layer is easily formed, and therefore it is possible to manufacture a film-shaped photosensitive resin composition used for manufacture of a printed wiring board. When the thickness $T_1$ of the first photosensitive resin layer is 50 μm or less, it is easy for a fine pattern to be formed in the first photosensitive resin layer. Further, the thickness $T_1$ of the first photosensitive resin layer refers to a thickness of the first photosensitive resin layer 3 on the conductor circuits 2a and 2b, as illustrated in FIG. 2.

A portion of the first photosensitive resin layer 3 not removed after a subsequent developing process is then exposed by irradiating with an active ray through a mask pattern, and the first photosensitive resin layer 3 in the exposed portion is photo-cured (an exposing process in the first patterning process). As a light source for the active ray, a known light source may be used, and for example, a light source which efficiently emits ultraviolet rays, such as a carbon arc lamp, a mercury vapor arc lamp, a super high-pressure mercury lamp, a high-pressure mercury lamp, or a xenon lamp may be used. Further, direct laser exposure of a direct drawing scheme may be used. An exposure amount differs according to a device or a composition of a photosensitive resin composition which is used, but an exposure amount is preferably 10 mJ/cm$^2$ to 600 mJ/cm$^2$, and more preferably 20 mJ/cm$^2$ to 400 mJ/cm$^2$. When the exposure amount is 10 mJ/cm$^2$ or more, the photosensitive resin composition can be sufficiently photo-cured, and when the exposure amount is 600 mJ/cm$^2$ or less, photo-curing is not excessive and the pattern of the first photosensitive resin layer 3 can be stably formed after development.

Figure 3:
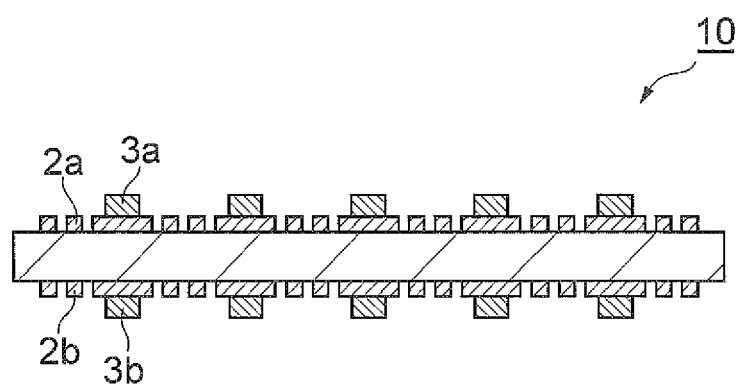
FIG. 3 is a cross-sectional view illustrating a first patterning process subsequent to FIG. 2.

Then, patterns 3a and 3b of the first photosensitive resin layer are formed on both surfaces of the printed wiring board, as illustrated in FIG. 3, by removing both surfaces of the first photosensitive resin layer 3 other than the exposure portion through development (a developing process of the first patterning process). The patterns 3a and 3b of the first photosensitive resin layer are removed in an opening formation process, which will be described below, and become fine openings formed in a heat-curable resin layer 4 (see FIG. 6). For example, an alkali developing solution such as a sodium carbonate solution (1 to 5 wt % aqueous solution) of 20° C. to 50° C. is used as a developing solution at this time, and developing is performed using a known method such as spraying, rocking dipping, brushing or scraping. Accordingly, predetermined patterns 3a and 3b of the first photosensitive resin layer are formed.

Figure 4:
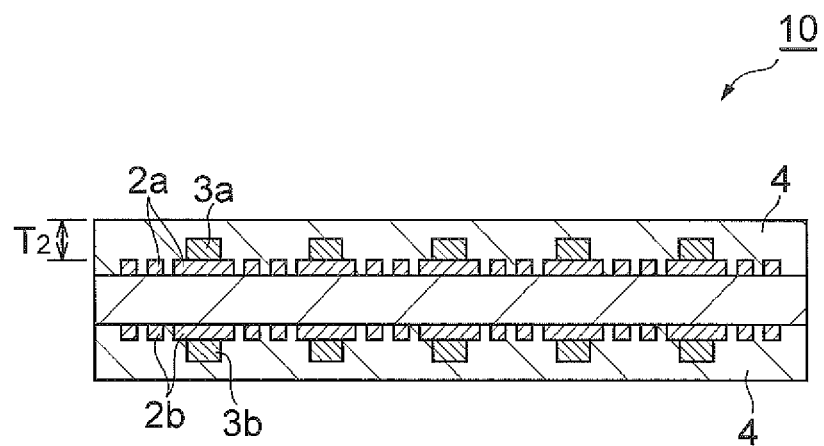
FIG. 4 is a cross-sectional view illustrating a heat-curable resin layer formation process subsequent to FIG. 3.

After the developing process, the heat-curable resin layer 4 including a heat-curable resin composition, which will be described below, is formed on the printed wiring board 10 to cover the patterns 3a and 3b of the first photosensitive resin layer, as illustrated in FIG. 4 (a heat-curable resin layer formation process). In the process of forming the heat-curable resin layer 4, the heat-curable resin layer 4 is formed on the printed wiring board by undergoing an application process using known screen-printing or a roll coater in the case of a liquid or a pasting process using vacuum lamination or the like in the case of a film. Either the liquid composition or the film composition may be applied as the heat-curable resin composition used for formation of the heat-curable resin layer, but the film composition whose thickness is managed in advance may be preferably used to control a thickness of the heat-curable resin layer 4 with high precision.

A thickness $T_2$ of the heat-curable resin layer 4 is preferably 2 μm to 50 μM, and more preferably 5 μm to 30 μm. When the thickness $T_2$ of the heat-curable resin layer 4 is 2 μm, a film of a heat-curable resin composition used for formation of the heat-curable resin layer 4 is easily formed and therefore a film-shaped heat-curable resin composition used for manufacture of the printed wiring board can be easily prepared. When the thickness $T_2$ of the heat-curable resin layer is 50 μm or less, it is easy for a fine pattern to be formed in the heat-curable resin layer 4. The thickness $T_2$ of the heat-curable resin layer 4 refers to the thickness of the heat-curable resin composition on the conductor circuits 2a and 2b, as illustrated in FIG. 4. Further, it is preferable for the thickness $T_1$ of the first photosensitive resin layer 3 and the thickness $T_2$ of the heat-curable resin layer 4 to be the same thickness.

In a heat-curable resin layer formation process, it is preferable for a ratio ($T_2/T_1$) of the thickness $T_2$ of the heat-curable resin layer 4 to the thickness $T_1$ of the first photosensitive resin layer 3 to be 1.0 to 2.0, and is more preferable for the ratio to be 1.0 to 1.5. When ($T_2/T_1$) is 1.0 or more, the patterns 3a and 3b of the first photosensitive resin layer are easily buried with a heat-curable resin composition in the heat-curable resin layer formation process, and therefore reliability of the obtained printed wiring board can increase more. On the other hand, when ($T_2/T_1$) is 2.0 or less, the openings can be formed in the heat-curable resin layer 4 within a short time and the printed wiring board can be more efficiently manufactured, thereby preventing deterioration of a medicinal solution when a desmearing process is used.

Then, the formed heat-curable resin layer 4 is heat-cured (a heat-curing process). In the heat-curing process, it is preferable for a temperature to be 150° C. to 250° C., and for a heating time to be 30 minutes to 300 minutes. Further, it is more preferable for the temperature to be 160° C. to 200° C., and for the heating time to be 30 minutes to 120 minutes. When the temperature is 150° C. or more and the heating time is 30 minutes or more, the heat-curable resin layer 4 can be sufficiently cured, and therefore the heat-curable resin layer 4 is easily removed and the conductor circuits 2a and 2b are easily exposed in the subsequent pattern exposure process and the subsequent opening formation process. On the other hand, when the temperature is 250° C. or less and the heating time is 300 minutes or less, oxidation of surfaces of the conductor circuits 2a and 2b can be suppressed and peeling of the heat-curable resin layer 4 in an interface of the conductor circuits 2a and 2b can be suppressed. Further, a clean oven is generally used for heat-curing, and curing may be performed in an atmosphere of an inert gas such as nitrogen in order to suppress oxidation of the copper.

Then, a portion of the heat-curable resin layer 4 after the heat curing is removed by performing the desmearing process to thereby expose predetermined places of the patterns 3a and 3b of the first photosensitive resin layer from the heat-curable resin layer 4 (a pattern exposure process).

The desmearing process may be performed, for example, by immersing a process target board into a mixed liquid such as a sodium permanganate solution, a sodium hydroxide solution, a potassium permanganate solution, a chromic solution, or sulfuric acid. Specifically, after the process target board is subjected to swelling treatment using boiling water or a predetermined swelling liquid, the residue or the like is removed using the sodium permanganate solution or the like, reduction (neutralization) is performed, and then washing with water, washing with hot water and drying are performed. If a sufficient opening is not formed when the process is performed once, the process may be performed multiple times. Further, the desmearing process is not limited to the foregoing. Further, the heat-curing process may be performed again after the desmearing process. This is because the heat-curing can be performed, a glass transition temperature can be increased, and low thermal expansion can be achieved, even though effects are different according to the used heat-curable resin.

Figure 6:
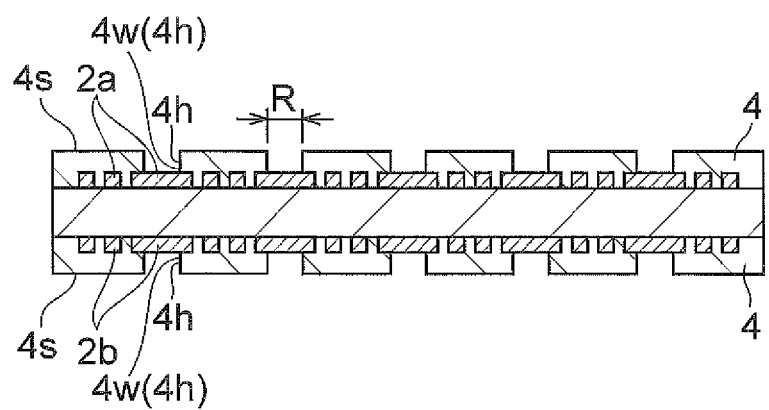
FIG. 6 is a cross-sectional view illustrating an opening formation process subsequent to FIG. 5.

After the patterns 3a and 3b of the first photosensitive resin layer are exposed from the heat-curable resin layer 4, the patterns 3a and 3b of the first photosensitive resin layer exposed from the heat-curable resin layer 4 are removed through the desmearing process to expose the conductor circuits 2a and 2b, as illustrated in FIG. 6 (an opening formation process). Thus, an opening 4h is formed in the heat-curable resin layer 4.

Further, in the pattern exposure process, the heat-curable resin layer 4 may be removed using plasma processing or a polishing process in place of the desmearing process. The heat-curable resin layer 4 may be removed using two or more of the desmearing process, the plasma processing and the polishing process. When the thickness $T_2$ of the heat-curable resin layer 4 is great, it is preferable for the heat-curable resin layer 4 to be removed through the polishing process based on sandblasting, mechanical polishing, or chemical mechanical polishing (CMP). Further, in the opening formation process, the patterns 3a and 3b of the first photosensitive resin layer may be removed using plasma processing in place of the desmearing process, or the patterns 3a and 3b of the first photosensitive resin layer may be removed using both the desmearing process and the plasma processing. The pattern exposure process and the opening formation process may be performed by individual apparatuses, or these processes may be performed by an apparatus incorporated with a series of processes.

In the plasma processing, for example, an active or inert gas such as argon gas, nitrogen gas, helium gas, monosilane gas, oxygen gas, hydrogen gas, or chlorine gas may be used. Further, these may be used together. For a plasma processing apparatus, a barrel type or parallel-plate type of plasma processing apparatus may be used. Further, plasma processing output, flow amount and processing time may be appropriately selected.

In the polishing process, specifically, the heat-curable resin layer 4 is grinded with a coated abrasive or sandpaper having a polishing agent bonded to paper, cloth or the like using an apparatus such as a polishing machine or a grinder. The polishing agent is not particularly limited, but an artificial polishing agent such as molten alumina or silicon carbide, or a natural polishing agent such as garnet or emery is used. A particle size of an abrasive grain is not particularly limited, but it is preferable to finally perform grinding with #1500 or more so that no scratches are left on a surface.

It is preferable for a diameter (R illustrated in FIG. 6) of the opening formed in the heat-curable resin layer 4 to be 60 μm or less in the opening formation process. Further, a ratio ($D/R_{min}$) of a depth of a smallest opening among the openings formed in the heat-curable resin layer 4 to a diameter $R_{min}$ of the smallest opening is preferably 0.1 to 1.0, and more preferably 0.2 to 0.8. If ($D/R_{min}$) is 0.1 or more, the heat-curable resin layer 4 is not too thin, and therefore a shape of the opening 4h can be stably held even when a fine opening is formed in the heat-curable resin layer 4. On the other hand, when ($D/R_{min}$) is 1.0 or less, it is easy to remove the first photosensitive resin layer 3 and easier to form a fine opening having a diameter of 60 μm or less. The shape of the opening 4h is a circular shape, but may be an elliptical shape or the like. Further, when the shape of the opening is not a circle, the diameter $R_{min}$ may be a diameter corresponding to the circle.

Figure 7:
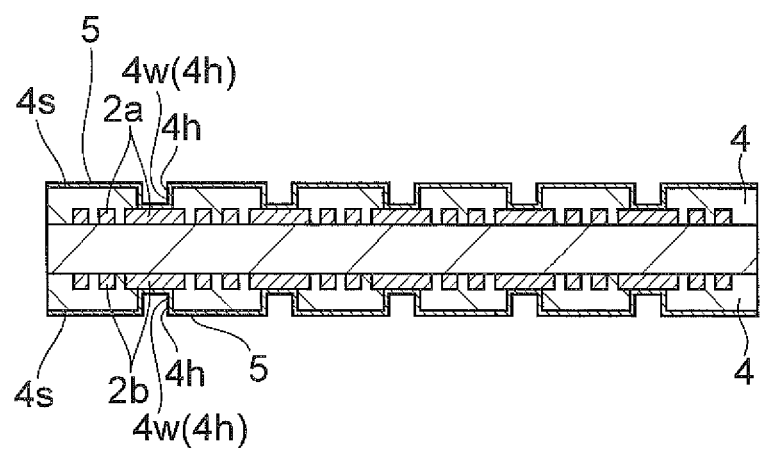
FIG. 7 is a cross-sectional view illustrating a seed layer formation process subsequent to FIG. 6.

Then, the seed layer 5 is formed on both surfaces using an electroless plating method to cover at least a portion of the heat-curable resin layer 4 after the opening 4h is formed, as illustrated in FIG. 7 (a seed layer formation process). In the seed layer formation process, the seed layer 5 is formed on a surface 4s of the heat-curable resin layer 4 in a portion in which the opening 4h is not provided, a wall surface 4w of the heat-curable resin layer 4 in a portion in which the opening 4h is provided, and surfaces of the exposed conductor circuits 2a and 2b. A thickness of the seed layer 5 is not particularly limited, but is preferably 0.1 μm to 1.0 μm under normal circumstances. The seed layer 5 may be formed using a sputtering method other than the electroless copper plating method. The target may be appropriately selected, but Cu is generally deposited after Ti. A thickness of Ti or Cu is not particularly limited, but the thickness of Ti is preferably 20 nm to 100 nm and the thickness of Cu is preferably 100 nm to 500 μm.

Figure 8:
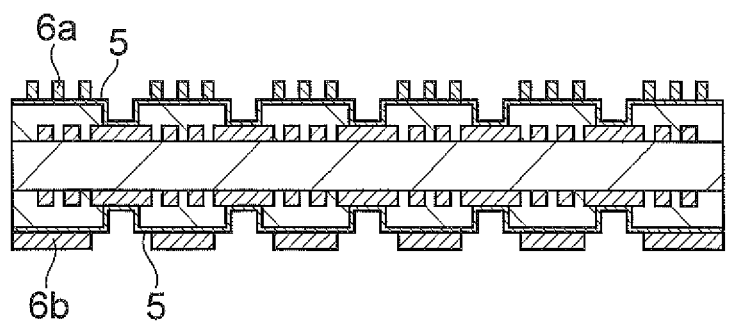
FIG. 8 is a cross-sectional view illustrating a second patterning process subsequent to FIG. 7.

Then, the film-shaped photosensitive resin composition is adhered to both surfaces to form a second photosensitive resin layer, a photo tool having a predetermined pattern formed therein is brought into close contact therewith, and an exposure process and a developing process are performed to pattern the second photosensitive resin layer on both surfaces (a second patterning process), as illustrated in FIG. 8. For the patterns 6a and 6b of the second photosensitive resin layers formed on both surfaces, the pattern 6a of the second photosensitive resin layer has a smaller pattern pitch than the pattern 6b of the second photosensitive resin layer in order to form a fine wiring pattern in a portion closer to the surface on which the semiconductor element is mounted.

Figure 9:
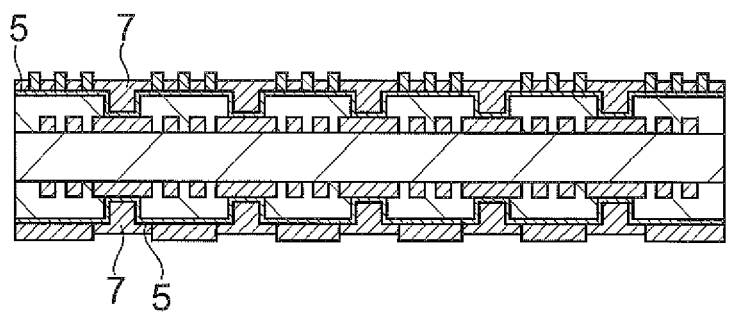
FIG. 9 is a cross-sectional view illustrating a state in which a wiring portion has been formed in a wiring portion patterning process subsequent to FIG. 8.

Then, a wiring portion 7 is formed using an electrolytic plating method such as copper electrolytic plating to cover at least a portion of the seed layer 5, as illustrated in FIG. 9. In this process, the wiring portion 7 is formed on the surface of the seed layer 5 other than an area in which the patterns 6a and 6b of the second photosensitive resin layers are formed. In the area in which the opening 4h is formed, the wiring portion 7 is formed on the seed layer 5 formed on the wall surface 4w and the surfaces of the conductor circuit 2a and 2b. It is preferable for the thickness of the wiring portion 7 to be 1 μm to 20 μm. Then, the patterns 6a and 6b of the second photosensitive resin layer are peeled using a peeling solution to form wiring patterns 7a and 7b (a wiring portion patterning process). Then, the seed layer 5 in the area in which the wiring portion 7 is not formed is removed through etching using an etching liquid (a seed layer removal process).

Figure 10:
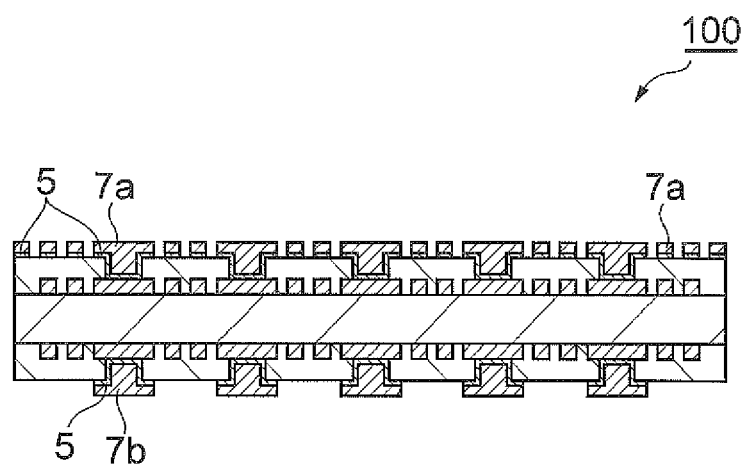
FIG. 10 is a cross-sectional view illustrating a state in which a wiring portion has been patterned in a wiring portion patterning process subsequent to FIG. 8.
Figure 11:
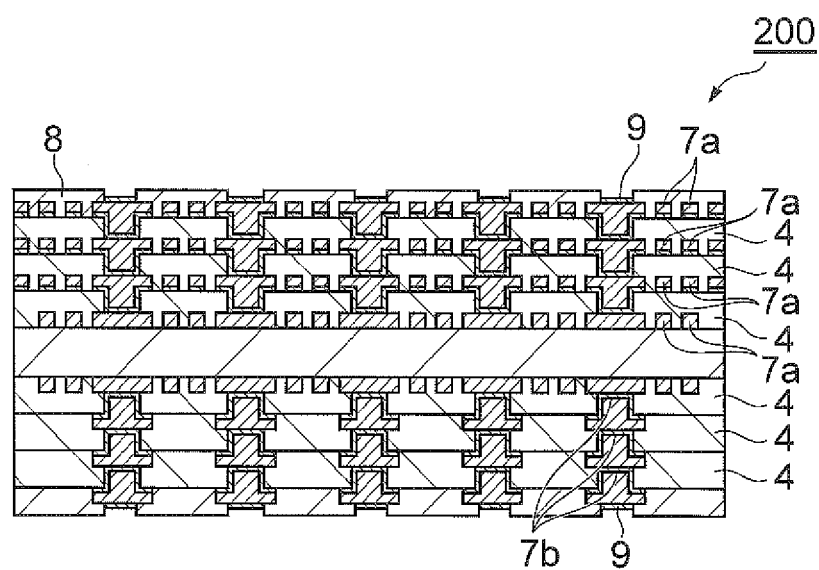
FIG. 11 is a cross-sectional view schematically illustrating a multilayer printed wiring board including a solder-resist and a nickel/gold layer on a surface on which a wiring portion is formed.

Through the above-described process, a multilayer printed wiring board 100 having the wiring portion (the wiring patterns 7a and 7b) on the surfaces can be obtained, as illustrated in FIG. 10. Further, a series of processes from the photosensitive resin layer formation process to the seed layer removal process described above is repeated for both front and back surfaces of the multilayer printed wiring board 100, the solder-resist 8 is formed on the outermost layer, and the nickel/gold layer 9 is formed by performing a plating process using a commercially available electroless nickel/gold plating liquid or the like, thereby obtaining a multilayer printed wiring board 200 as illustrated in FIG. 11. For example, the multilayer printed wiring board 200 has a three-layered wiring portion (wiring patterns 7a and 7b) formed by repeating a series of processes from the photosensitive resin layer formation process to the seed layer removal process three times. In the multilayer printed wiring board 200, the wiring portions (the wiring patterns 7a and 7b) formed in the respective heat-curable resin layers 4 are electrically connected.

The multilayer printed wiring board 100 or 200 described above is preferred as a printed wiring board for mounting a flip chip type semiconductor element whose refinement and densification advance. Above all, the multilayer printed wiring board is particularly suitable for a printed wiring board in which a size of the mounted semiconductor element is large, for electrically connecting with tens of thousands of bumps arranged in an area array form on a surface of the semiconductor element.

Next, the photosensitive resin composition and the heat-curable resin composition used for manufacture of the above-described multilayer printed wiring boards 100 and 200 will be described in detail, but the present invention is not limited to these resin compositions.

The photosensitive resin composition used for manufacture of the multilayer printed wiring boards 100 and 200 is not particularly limited, but the following is preferred. In other words, it is preferable for the photosensitive resin composition suitable for formation of the photosensitive resin layer to contain (a) a binder polymer, (b) a photopolymerizable compound containing at least one ethylenically unsaturated bond, and (c) a photopolymerization initiator.

This photosensitive resin composition can be used when both the first photosensitive resin layer and the second photosensitive resin layer are formed.

It is preferable for the photosensitive resin composition not to contain (d) an inorganic filler. In this case, resolution after development is improved, a fine pattern can be formed, and a side surface of the opening portion after peeling in the desmearing process tends to be smooth. Further, when the (d) inorganic filler is contained in the photosensitive resin composition, it is preferable for a maximum particle size to be 5 μm or less, and for an average particle size to be 1 μm or less.

Examples of the (a) binder polymer (hereinafter also conveniently referred to as "(a) component") may include such as an acryl-based resin, a styrene-based resin, an epoxy-based resin, an amide-based resin, an amide epoxy-based resin, an alkyd-based resin, and a phenol-based resin. From the viewpoint of alkali developability, the acryl-based resin is preferable. These may be individually used or may be used in combination of two or more kinds. The (a) binder polymer may be prepared, for example, by a radically polymerizing a polymerizable monomer.

Examples of the polymerizable monomer may include a polymerizable styrene derivative substituted in an α-position or an aromatic ring such as styrene, vinyl toluene or α-methyl styrene, an acrylamide such as diacetone acrylamide, acrylonitrile, an ether of vinyl alcohol such as vinyl-n-butyl ether, (meth)acrylic acid alkyl ester, (meth) acrylic acid benzyl ester, (meth)acrylic acid tetrahydrofurfuryl ester, (meth)acrylate dimethylaminoethyl ester, (meth) acrylic acid diethylaminoethyl ester, (meth)acrylic acid glycidyl ester, 2,2,2-trifluoroethyl (meth)acrylate, 2,2,3,3-tetrafluoropropyl (meth)acrylate, (meth)acrylic acid, α-bromo-(meth)acrylic acid, α-chloro(meth)acrylic acid, β-furyl(meth)acrylic acid, β-styryl (meth)acrylic acid, maleic acid, maleic anhydride, maleic acid monoester such as maleic acid mono-methyl ester, maleic acid mono-ethyl ester, or maleic acid mono-isopropyl, fumaric acid, cinnamic acid, α-cyanocinnamic acid, itaconic acid, crotonic acid, and propiolic acid. These may be individually used or may be used in combination of two or more kinds.

Further, it is preferable for the (a) binder polymer to contain a carboxyl group from the standpoint of alkali developability and, for example, the binder polymer can be prepared by radically polymerizing a polymerizable monomer having a carboxyl group and another polymerizable monomer. The polymerizable monomer having the carboxyl group is preferably (meth)acrylic acid and more preferably methacrylic acid.

From the standpoint of balance of alkali developability and alkali resistance, the carboxyl group content of the (a) binder polymer (a ratio of a polymerizable monomer having the carboxyl group to a used total polymerizable monomer) is preferably 12 to 50 mass %, more preferably 12 to 40 mass %, still more preferably 15 to 30 mass %, and particularly preferably 15 to 25 mass %. When this carboxyl group content is 12 mass % or more, the alkali developability becomes good, and when the carboxyl group content is 50 mass % or less, the alkali resistance can increase.

A weight average molecular weight of the (a) binder polymer is preferably 20,000 to 300,000, more preferably 40,000 to 150,000, and still more preferably 50,000 to 120,000 in terms of balance of mechanical strength and alkali developability. When the weight average molecular weight is 20,000 or more, developing solution resistance can increase, and when the weight average molecular weight is 300,000 or less, a developing time can be shortened. Further, in this embodiment, the weight average molecular weight is assumed to be a value measured using a gel permeation chromatography method and converted using a calibration curve produced using standard polystyrene.

Examples of the (b) photopolymerizable compound (hereinafter conveniently referred to as "(b) component") containing at least one ethylenically unsaturated bond may include a compound obtained by reacting α,β-unsaturated carboxylic acid to a polyhydric alcohol, a bisphenol A-based (meth)acrylate compound, a compound obtained by reacting an α,β-unsaturated carboxylic acid to a glycidyl-group-containing compound, or an urethane monomer such as a (meth)acrylate compound having a urethane bond, nonylphenoxy tetraethyleneoxy (meth) acrylate, nonylphenoxy octaethyleneoxy (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, a (meth)acrylic acid alkyl ester or the like. These may be individually used or may be used in combination of two or more kinds.

From the standpoint of balance between optical sensitivity and resolution, the content of the (b) component is preferably 10 to 40 parts by mass, and more preferably, 20 to 30 parts by mass with respect to a total of 100 parts by mass of the (a) component and the (b) component.

Examples of the photopolymerization initiator of the (c) component may include an aromatic ketone such as benzophenone, N,N,N',N'-tetramethyl-4,4'-diaminobenzophenone (Michler ketone), N,N,N',N'-tetraethyl-4,4'-diaminobenzophenone, 4-methoxy-4'-dimethylamino benzophenone, 2-benzyl-2-dimethylamino-1-(4-morpholino phenyl)-butanone-1 or 2-methyl-1-[4-(methylthio)phenyl]-2-morpholino-propanone-1, quinones such as 2-ethyl anthraquinone, phenanthrenequinone, 2-tert-butyl anthraquinone, octamethyl anthraquinone, 1,2-benzanthraquinone, 2,3-benzanthraquinone, 2-phenyl anthraquinone, 2,3-diphenyl anthraquinone, 1-chloroanthraquinone, 2-methyl anthraquinone, 1,4-naphthoquinone, 9,10-phenanthraquinone, 2-methyl 1,4-naphthoquinone or 2,3-dimethyl anthraquinone, a benzoin ether compound such as benzoin methyl ether, benzoin ethyl ether, or benzoin phenyl ether, a benzoin compound such as benzoin, methylbenzoin, or ethylbenzoin, a benzyl derivative such as benzyl dimethyl ketal, substituted anthracenes such as 9,10-dimethoxy anthracene, 9,10-diethoxy anthracene, 9,10-dipropoxy anthracene, 9,10-dibutoxy anthracene or 9,10-dipentoxy anthracene, or a 2,4,5-triarylimidazole dimer such as 2-(o-chlorophenyl)-4,5-diphenylimidazole dimer, 2-(o-chlorophenyl)-4,5-di(methoxyphenyl) imidazole dimer, 2-(o-fluorophenyl)-4,5-diphenylimidazole dimer, 2-(o-methoxyphenyl)-4,5-diphenylimidazole dimer, or 2-(p-methoxyphenyl)-4,5-diphenylimidazole dimer, a coumarin compound, an oxazole-based compound, a pyrazoline compound or the like. Here, two substituent groups of an aryl group of a 2,4,5-triarylimidazole may give the same target compounds or may give different asymmetrical compounds. Further, a thioxanthone compound and a tertiary amine compound may be combined, like a combination of diethylthioxanthone and dimethylamino benzoic acid. Further, a 2,4,5-triarylimidazole dimer is more preferable from the standpoint of balance between close contact and sensitivity. These may be individually used or in combination of two or more kinds.

The content of the (a) binder polymer is preferably 30 to 80 parts by mass, more preferably 40 to 75 parts by mass, and still more preferably 50 to 70 parts by mass with respect to a total amount of 100 parts by mass of the (a) component and the (b) component. If the content of the (a) component is in this range, a coating property of the photosensitive resin composition and the strength of the light-cured material improve. The content of the (b) photopolymerizable compound containing at least one ethylenically unsaturated bond described above is preferably 20 to 60 parts by mass, more preferably 30 to 55 parts by mass, and still more preferably 35 to 50 parts by mass with respect to a total amount of 100 parts by mass of the (a) component and the (b) component. When the content of the (b) component is in this range, optical sensitivity and a coating property of the photosensitive resin composition become better.

The content of the (c) photopolymerization initiator described above is preferably 0.01 to 30 parts by mass, more preferably 0.1 to 20 parts by mass, and still more preferably 0.2 to 10 parts by mass with respect to a total amount of 100 parts by mass of the (a) component and the (b) component. When the content of the (c) component is in this range, optical sensitivity and an internal photocuring property of the photosensitive resin composition improve.

The photosensitive resin composition is preferably filler-less and is not filled with the (d) inorganic filler, but may be filled with a small amount of the (d) inorganic filler. An amount of shrinkage can be reduced, rigidity can increase, and precision of a thickness dimension can be improved by the photosensitive resin composition being filled with the small amount of the (d) inorganic filler. When a filling amount of the (d) inorganic filler is less than 5 parts by mass with respect to a total amount of 100 parts by mass of the photosensitive resin composition, the resolution property can increase.

An example of the (d) inorganic filler may include an inorganic filler such as barium sulfate, barium titanate, powdered silicon oxide, amorphous silica, talc, clay, fired kaolin, magnesium carbonate, calcium carbonate, aluminum oxide, aluminum hydroxide, or mica powder. Particularly preferably, a silane coupling agent is used to be dispersed in the resin without being aggregated with a primary particle size left in the silica filler. The maximum particle size of the (d) inorganic filler is preferably 2 μm or less and more preferably 1 μm or less. Further, the average particle size of the (d) inorganic filler is preferably 300 nm or less and more preferably 100 nm or less from the viewpoint of resolution.

Further, 0.01 to 20 parts by mass of a dye such as malachite green, Victoria pure blue, brilliant green or methyl violet, a photochromic agent such as tribromophenylsulfone, leuco crystal violet, diphenylamine, benzylamine, triphenylamine, diethyl aniline, o-chloroaniline or tertiary butyl catechol, a heat coloring inhibitor, a plasticizer such as p-toluenesulfonamide, a pigment, a filler, an anti-foaming agent, a flame retardant, a tackifier, a leveling agent, a peeling promoter, an antioxidant, a perfume, an imaging agent, a thermal crosslinking agent, a polymerization inhibitor, or the like with respect to a total amount of 100 parts by mass of the (a) component and the (b) component may be contained in the photosensitive resin composition, as necessary. These may be individually used or may be used in combination of two or more kinds.

The photosensitive resin composition may be dissolved in a solvent such as methanol, ethanol, acetone, methyl ethyl ketone, methyl cellosolve, ethyl cellosolve, toluene, N,N-dimethylformamide, or propylene glycol monomethyl ether, or a mixture thereof, as necessary, and applied as a solution of solid content of 30 to 60 mass %. These may be individually used or may be used in combination of two or more kinds.

The photosensitive resin composition is not particularly limited, but is preferably used as a liquid resist applied on a metal surface, e.g., a surface of copper, a copper-based alloy, nickel, chrome, iron, or an iron-based alloy such as stainless steel, preferably copper, a copper-based alloy, or an iron-based alloy, dried and then coated with a protection film as necessary, or used in the form of a photosensitive element.

A form of the photosensitive element includes a support, and a photosensitive resin composition layer (a resin layer) formed by uniformly applying a solution of the photosensitive resin composition on the support and performing drying. A protection film with which the layer of the photosensitive resin composition is coated may be further included on the layer of the photosensitive resin composition. The support may include a heat-resistant and solvent-resistant polymer film such as polyethylene terephthalate, polypropylene, polyethylene or polyester. The photosensitive element may be obtained, for example, by applying the photosensitive resin composition on a heat-resistant and solvent-resistant polymer film and drying. It is preferable to use a polyethylene terephthalate film in terms of transparency.

The heat-curable resin composition used to manufacture the multilayer printed wiring boards 100 and 200 is not particularly limited, but the following heat-curable resin composition is preferred. In other words, the heat-curable resin composition preferred to form the heat-curable resin layer 4 is preferably a heat-curable resin composition containing a resin composition including at least one selected from the group consisting of an epoxy resin, a phenolic resin, a cyanate ester resin, a polyamide-imide resin, and a heat-curable polyimide resin, and an inorganic filler having a maximum particle size of 5 μm or less and an average particle size of 1 μm or less.

It is preferable for the epoxy resin to be an epoxy resin having one or more glycidyl groups in a molecule. A filling amount of the inorganic filler is preferably in a range of 0 to 90 mass %, more preferably in a range of 20 to 70 mass %, and still more preferably 30 to 60 mass %.

Any epoxy resin may be used as long as the epoxy resin has two or more glycidyl groups, but preferably is a bisphenol A type epoxy resin, a bisphenol F type epoxy resin, a novolac phenol type epoxy resin, a biphenyl type epoxy resin, a bisphenol S type epoxy resin such as a bisphenol S diglycidyl ether, a naphthalene type epoxy resin, a dicyclopentadiene type epoxy resin, a bixylenol type epoxy resin such as bixylenol diglycidyl ether, a hydrogenated bisphenol A type epoxy resin such as a hydrogenated bisphenol A glycidyl ether, or a dibasic acid-modified diglycidyl ether type epoxy resin thereof. These may be individually used or may be used in combination of two or more kinds.

A commercially available epoxy resin may include a naphthalene type epoxy resin such as EXA4700 (tetrafunctional naphthalene type epoxy resin) made by DIC Corporation or NC-7000 (naphthalene skeleton-containing multi-functional solid epoxy resin) made by Nippon Kayaku Co., Ltd.; an epoxidized product (tris phenol type epoxy resin) of a condensate of a phenol such as EPPN-502H (tris phenol epoxy resin) made by Nippon Kayaku Co., Ltd. and an aromatic aldehyde having a phenolic hydroxyl group; a dicyclopentadiene aralkyl type epoxy resin such as EPICLON HP-7200H (dicyclopentadiene skeleton-containing multi-functional solid epoxy resin) made by DIC Corporation; a biphenyl aralkyl type epoxy resin such as NC-3000H (biphenyl skeleton-containing multi-functional solid epoxy resin) made by Nippon Kayaku Co., Ltd.; a novolac type epoxy resin such as EPICLON N660 and EPICLON N690 made by DIC Corporation or EOCN-104S made by Nippon Kayaku Co., Ltd.; a bisphenol A type epoxy resin such as tris(2,3-epoxypropyl)isocyanurate such as TEPIC made by Nissan Chemical Industries, Co., Ltd., EPICLON 860, EPICLON 900-IM, EPICLON EXA-4816, and EPICLON EXA-4822 made by DIC Corporation, Araldite AER280 made by Asahi Chiba Co., Ltd., EPOTOHTO YD-134 made by Tohto Kasei Co., Ltd., JER834 and JER872 made by Japan Epoxy Resin Co., Ltd., or ELA-134 made by Sumitomo Chemical Co., Ltd.; a naphthalene type epoxy resin such as EPICLON HP-4032 made by DIC Corporation; a phenolic novolac type epoxy resin such as EPICLON N-740 made by DIC Corporation, an epoxy resin of a condensate of phenol and salicylaldehyde; EPPN-500 series made by Nippon Kayaku Co., Ltd or the like. These epoxy resins may be individually used or may be used in combination of two or more kinds.

Among the epoxy resins described above, a biphenyl aralkyl type epoxy resin such as NC-3000H (biphenyl skeleton-containing multi-functional solid epoxy resin) made by Nippon Kayaku Co., Ltd. is preferable in that the resin is excellent in close contact and insulation with copper. It is more preferable to use EPPN-500 series made by Nippon Kayaku Co., Ltd. in that high Tg with crosslink density can be obtained.

The content of the epoxy resin is preferably 30 to 90 parts by mass and more preferably 40 to 80 parts by mass with respect to 100 parts by mass of the resin component other than the inorganic filler component.

Various known epoxy resin curing agents or epoxy resin curing accelerators may be compounded as a curing agent compounded with the epoxy resin. For example, known curing agents may be individually used or in combination of two or more kinds irrespective of a curing agent or a curing accelerator, such as an organic phosphine-based compound such as triphenyl phosphine, tetraphenyl phosphonium, or tetraphenyl borate, DSU or its derivatives, in addition to a phenolic resin, an imidazole compound, an acid anhydride, an aliphatic amine, an alicyclic polyamine, an aromatic polyamine, a tertiary amine, a dicyandiamide, a guanidine, or an epoxy adduct or a microcapsule thereof. The curing agent is not particularly limited as long as the curing agent cures the epoxy resin, but specific examples thereof may include 4,4'-diaminodiphenyl sulfone, 4,4'-bis(4-amino phenoxy)biphenyl, 2,2-bis[4-(4-amino phenoxy)phenyl]propane, 1,3-bis(4-amino phenoxy)benzene, 1,4-bis(4-amino phenoxy)benzene, trimethylene bis(4-amino benzoate), 3,3'-dimethyl-4,4'-diamino biphenyl, 2,2'-dimethyl-4,4'-diamino biphenyl, 4,4'-diamino diphenyl ether, 3,4'-diamino diphenyl ether, bis[4-(4-amino phenoxy)phenyl]sulfone, bis[4-(3-amino phenoxy)phenyl]sulfone, 9,9'-bis(4-aminophenyl)

fluorene, 2,2-bis[4-(4-amino phenoxy)phenyl] hexafluoropropane or the like. These may be individually used or may be used in combination of two or more kinds.

The cyanate ester resin is a resin which produces a cured material in which a triazine ring is a repeating unit by heating, and since the cured material has an excellent dielectric characteristic, the cured material may be widely used, for example, when a high frequency property is required. The cyanate ester resin may include a cyanate ester product of 2,2-bis(4-cyanatophenyl)propane, bis(4-cyanatophenyl)ethane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, phenolic novolac and alkylphenolic novolac. Among them, 2,2-bis(4-cyanatophenyl) propane is preferable to use since the balance of the dielectric characteristic of the cured material and the curing property is particularly excellent, and it is inexpensive. Further, a kind of cyanate ester compound may be individually used or two or more kinds of cyanate ester compounds may be used in combination. Further, a portion of the cyanate ester compound used here may be oligomerized in a trimer or a pentamer in advance. Further, a curing catalyst or a curing accelerator may be put into the cyanate resin. A metal such as manganese, iron, cobalt, nickel, copper, or zinc may be used as the curing catalyst, and may be specifically used as an organometallic salt such as 2-ethyl hexanoate, naphthenate or octoate, and an organometallic complex such as an acetyl acetone complex. These may be individually used or may be used in combination of two or more kinds. It is preferable to use a phenol as the curing accelerator and, for example, a monofunctional phenol such as nonylphenol or paracumylphenol, a bifunctional phenol such as bisphenol A, bisphenol F, or bisphenol S, or a multifunctional phenol such as phenol novolac or cresol novolac may be used. These may be individually used or may be used in combination of two or more kinds.

It is preferable for a heat-curable resin composition to contain a maleimide compound having at least two unsaturated N-substituted maleimide groups in a molecular structure. Specifically, examples of the maleimide compound include N,N'-ethylene bismaleimide, N,N'-hexamethylene bismaleimide, N,N'-(1,3-phenylene)bismaleimide, N,N'-[1,3-(2-methyl phenylene)]bismaleimide, N,N'-[1,3-(4-methyl phenylene)]bismaleimide, N,N'-(1,4-phenylene)bismaleimide, bis(4-maleimide phenyl)methane, bis(3-methyl-4-maleimide phenyl)methane, 3,3-dimethyl-5,5-diethyl-4,4-diphenyl methane bismaleimide, bis(4-maleimide phenyl)ether, bis(4-maleimide phenyl)sulfone, bis(4-maleimide phenyl)sulfide, bis(4-maleimide phenyl)ketone, bis(4-maleimide cyclohexyl)methane, 1,4-bis(4-maleimide phenyl)cyclohexane, 1,4-bis(maleimide methyl)cyclohexane, 1,4-bis(maleimide methyl)benzene, 1,3-bis(4-maleimide phenoxy)benzene, 1,3-bis(3-maleimide phenoxy)benzene, bis[4-(3-maleimide phenoxy)phenyl]methane, bis[4-(4-maleimide phenoxy)phenyl]methane, 1,1-bis[4-(3-maleimide phenoxy)phenyl]ethane, 1,1-bis[4-(4-maleimide phenoxy)phenyl]ethane, 1,2-bis[4-(3-maleimide phenoxy)phenyl]ethane, 1,2-bis[4-(4-maleimide phenoxy)phenyl]ethane, 2,2-bis[4-(3-maleimide phenoxy)phenyl]propane, 2,2-bis[4-(4-maleimide phenoxy)phenyl]propane, 2,2-bis[4-(3-maleimide phenoxy)phenyl]butane, 2,2-bis[4-(4-maleimide phenoxy)phenyl]butane, 2,2-bis[4-(3-maleimide phenoxy)phenyl]-1,1,1,3,3,3-hexafluoropropane, 2,2-bis[4-(4-maleimide phenoxy)phenyl]-1,1,1,3,3,3-hexafluoropropane, 4,4-bis(3-maleimide phenoxy)biphenyl, 4,4-bis(4-maleimide phenoxy)biphenyl, bis[4-(3-maleimide phenoxy)phenyl] ketone, bis[4-(4-maleimide phenoxy)phenyl]ketone, 2,2'-bis(4-maleimide phenyl)disulfide, bis(4-maleimide phenyl)disulfide, bis[4-(3-maleimide phenoxy) phenyl]sulfide, bis[4-(4-maleimide phenoxy)phenyl]sulfide, bis[4-(3-maleimide phenoxy)phenyl]sulfoxide, bis[4-(4-maleimide phenoxy)phenyl]sulfoxide, bis[4-(3-maleimide phenoxy)phenyl]sulfone, bis[4-(4-maleimide phenoxy)phenyl]sulfone, bis[4-(3-maleimide phenoxy)phenyl]ether, bis[4-(4-maleimide phenoxy)phenyl]ether, 1,4-bis[4-(4-maleimide phenoxy)-α,α-dimethyl benzyl]benzene, 1,3-bis[4-(4-maleimide phenoxy)-α,α-dimethyl benzyl]benzene, 1,4-bis[4-(3-maleimide phenoxy)-α,α-dimethyl benzyl]benzene, 1,3-bis[4-(3-maleimide phenoxy)-α,α-dimethyl benzyl]benzene, 1,4-bis[4-(4-maleimide phenoxy)-3,5-dimethyl-α,α-dimethyl benzyl]benzene, 1,3-bis[4-(4-maleimide phenoxy)-3,5-dimethyl-α,α-dimethyl benzyl]benzene, 1,4-bis[4-(3-maleimide phenoxy)-3,5-dimethyl-α,α-dimethyl benzyl]benzene, 1,3-bis[4-(3-maleimide phenoxy)-3,5-dimethyl-α,α-dimethyl benzyl]benzene, and polyphenylmethane maleimide. These maleimide compounds may be individually used or may be used in mixture of two or more kinds.

Further, a polyimide resin, a polyamide-imide resin, or any resin containing a carboxylic acid may be used as another resin reacting to the epoxy resin. Examples of the polyamide-imide resin may include "Vylomax HR11NN," "Vylomax HR12N2," and "Vylomax HR16NN" of Toyobo. Co. Ltd. Examples of the resin containing a carboxylic acid may include an acrylic acid resin, an acid-modified epoxy acrylate, and an acid-containing urethane resin.

The content of the curing agent is preferably 5 to 50 parts by mass with respect to 100 parts by mass of a resin component except the inorganic filler component, and more preferably 10 to 40 parts by mass.

Any conventionally known inorganic or organic filler may be used as the inorganic filler, and the inorganic filler is not limited to a specific inorganic filler. For example, the inorganic filler may include an extender pigment such as barium sulfate, barium titanate, amorphous silica, crystalline silica, molten silica, spherical silica, talc, clay, magnesium carbonate, calcium carbonate, aluminum oxide, aluminum hydroxide, silicon nitride or aluminum nitride, or a metal powder such as copper, tin, zinc, nickel, silver, palladium, aluminum, iron, cobalt, gold or platinum.

When the silica filler is used, a silane coupling agent is preferably used to be dispersed in the resin without being aggregated with a primary particle size left in the filler. The maximum particle size is preferably 5 μm or less, and more preferably 1 μm or less. As the silane coupling agent, a generally available silane coupling agent may be used, and for example, an alkylsilane, an alkoxysilane, a vinylsilane, an epoxysilane, an aminosilane, an acrylic silane, a methacrylic silane, a mercaptosilane, a sulfide silane, an isocyanate silane, a sulphur silane, a styryl silane, or an alkyl chlorosilane may be used.

Concrete compound names include methyl trimethoxysilane, dimethyl dimethoxysilane, trimethyl methoxysilane, methyl triethoxysilane, methyl triphenoxysilane, ethyl trimethoxysilane, n-propyl trimethoxysilane, diisopropyl dimethoxysilane, isobutyl trimethoxysilane, diisobutyl dimethoxysilane, isobutyl triethoxysilane, n-hexyl trimethoxysilane, n-hexyl triethoxysilane, cyclohexylmethyl dimethoxysilane, n-octyl triethoxysilane, n-dodecyl methoxysilane, phenyl trimethoxysilane, diphenyl dimethoxysilane, triphenylsilanol, methyl trichlorosilane, dimethyl dichlorosilane, trimethyl chlorosilane, n-octyl dimethylchlorosilane, tetraethoxysilane, 3-aminopropyl trimethoxysilane, 3-aminopropyl triethoxysilane, 3-(2-aminoethyl)aminopropyl trimethoxysilane, 3-(2-aminoethyl) aminopropylmethyl dimethoxysilane, 3-phenyl aminopropyl trimethoxysilane, 3-glycidoxypropyl trimethoxysilane, 3-glycidoxypropylmethyl diethoxysilane, 3-glycidoxypropyl triethoxysilane, 3-glycidoxypropylmethyl dimethoxysilane, bis(3-(triethoxysilyl)propyl) disulfide, bis(3-(triethoxysilyl) propyl) tetrasulfide, vinyl triacetoxysilane, vinyl trimethoxysilane, vinyl triethoxysilane, vinyl triisopropoxysilane, allyl trimethoxysilane, diallyl dimethylsilane, 3-methacryloxypropyl trimethoxysilane, 3-methacryloxypropylmethyl dimethoxysilane, 3-methacryloxypropyl triethoxysilane, 3-mercaptopropyl trimethoxysilane, 3-mercaptopropylmethyl dimethoxysilane, 3-mercaptopropyl triethoxysilane, N-(1,3-dimethyl butylidene)-3-aminopropyl triethoxysilane, aminosilane, etc.

The average particle size of the inorganic filler is preferably 300 nm or less and more preferably 100 nm or less. As the average particle size of the inorganic filler is smaller, a surface after the desmearing process becomes smooth and filling characteristics of an underfill material tend to be improved at the time of subsequent mounting of a flip chip. A filling amount of the inorganic filler is preferably 0 to 90 mass %, more preferably 20 to 70 mass %, and still more preferably 30 to 60 mass %.

As described above, in the method for manufacturing a printed wiring board according to this embodiment, the opening 4h having any shape can be easily formed by patterning the first photosensitive resin layer 3 according to the shape of the opening formed in the heat-curable resin layer 4 in the first patterning process. Further, in the method for manufacturing a printed wiring board according to this embodiment, the residue of the photosensitive resin around the opening 4h can be reduced unlike a case in which the opening is formed using a laser, in addition to the fact that the plurality of openings 4h can be formed at the same time. Therefore, it is possible to sufficiently efficiently manufacture a printed wiring board having excellent reliability even when the number of pins of a semiconductor element increases and it is necessary to provide a great number of fine openings 4h.

Further, in this embodiment, a heat-curing process for heat-curing the heat-curable resin layer 4 is further included as a process immediately after the heat-curable resin layer formation process, and removal of a portion of the heat-curable resin layer 4 and removal of the first photosensitive resin layer 3 exposed from the heat-curable resin layer 4 are performed by performing the plasma processing and the desmearing process in the pattern exposure process and the opening formation process. In this case, it is possible to rapidly expose the first photosensitive resin layer 3 through plasma processing and the desmearing process and to more reliably reduce the residue around the opening 4h through the desmearing process.

Further, in this embodiment, a heat-curing process for heat-curing the heat-curable resin layer 4 is further included as a process immediately after the heat-curable resin layer formation process, and a portion of the heat-curable resin layer 4 after the heat curing is removed by performing the desmearing process in the pattern exposure process and the opening formation process, and the first photosensitive resin layer 3 exposed from the heat-curable resin layer 4 is removed. In this case, it is possible to rapidly expose the first photosensitive resin layer 3 through the desmearing process and to more reliably reduce the residue around the opening 4h.

Further, in this embodiment, a heat-curing process for heat-curing the heat-curable resin layer is further included as a process immediately after the heat-curable resin layer formation process, a portion of the heat-curable resin layer 4 after the heat curing is removed by performing the polishing process in the pattern exposure process, and the first photosensitive resin layer 3 exposed from the heat-curable resin layer 4 is removed by performing the desmearing process in the opening formation process. In this case, it is possible to rapidly expose the first photosensitive resin layer 3 through the polishing process and the desmearing process and to more reliably reduce the residue around the opening 4h through the desmearing process.

Further, in this embodiment, a heat-curing process for heat-curing the heat-curable resin layer 4 is further included as a process immediately after the heat-curable resin layer formation process, a portion of the heat-curable resin layer 4 after the heat curing is removed by performing the plasma processing in the pattern exposure process and the opening formation process, and the first photosensitive resin layer 3 exposed from the heat-curable resin layer 4 is removed. In this case, it is possible to rapidly expose the first photosensitive resin layer 3 through the plasma processing and to more reliably reduce the residue around the opening 4h.

Further, in this embodiment, it is more preferable to include a seed layer formation process for forming a seed layer 5 which is a base for the wiring patterns 7a and 7b using an electroless plating method to cover at least a portion of the heat-curable resin layer 4 after the opening 4h is formed, a second patterning process for forming the second photosensitive resin layer to cover the seed layer 5 and then patterning the second photosensitive resin layer by performing an exposure process and a developing process on the second photosensitive resin layer, a wiring portion patterning process for forming the wiring portion 7 using the electrolytic plating method to cover the seed layer 5 and then peeling the patterns 6a and 6b of the second photosensitive resin layer through a peeling process to pattern the wiring portion 7, and a seed layer removal process for removing the seed layer 5 in an area in which the wiring portion has not been formed. It is possible to form the wiring portion 7 using the electrolytic plating method and selectively pattern the wiring portion 7 by forming the seed layer 5.

Figure 12:
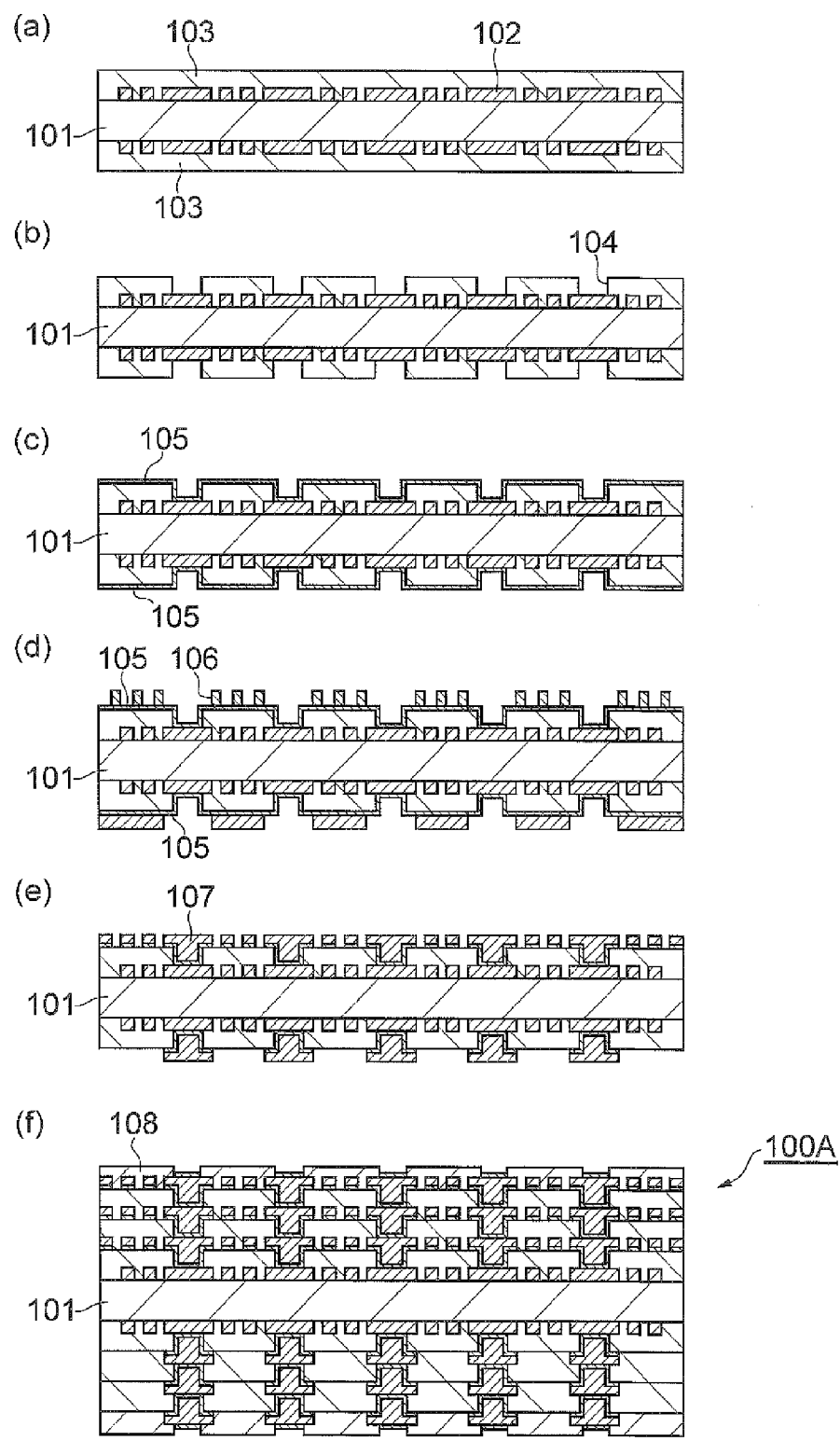
FIG. 12 is a cross-sectional view illustrating a conventional method for manufacturing a multilayer printed wiring board.
Figure 13:
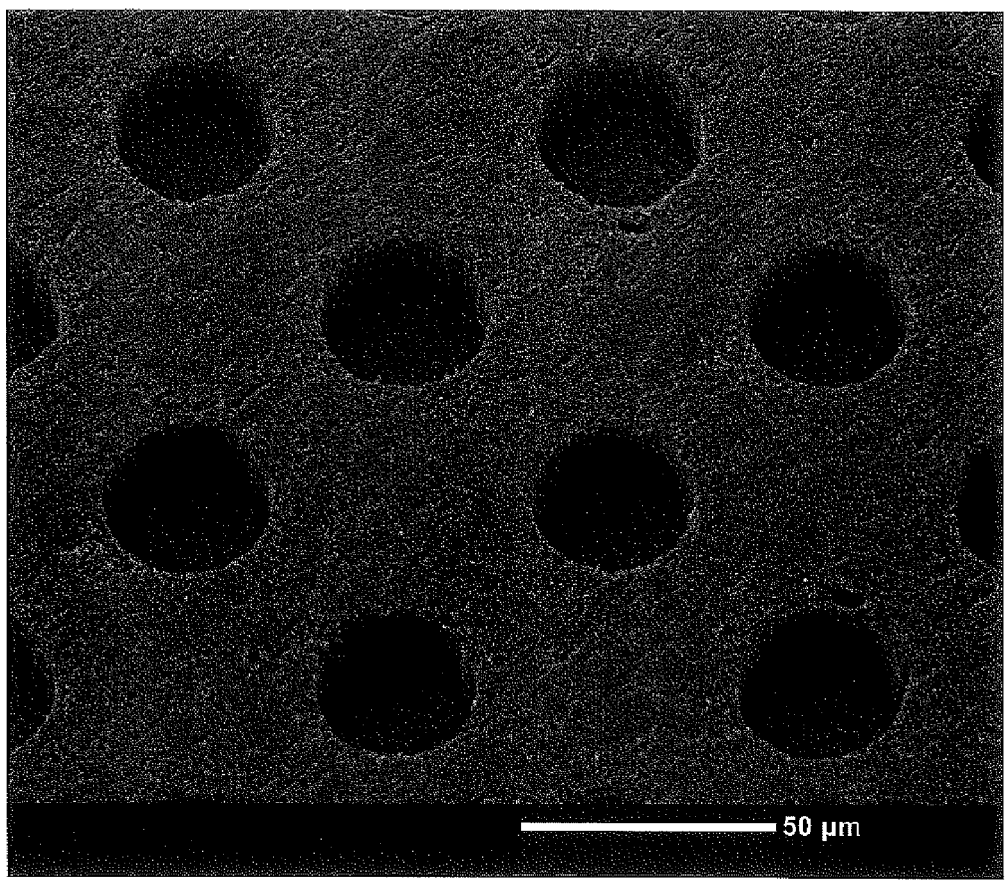
FIG. 13 is an SEM photograph showing openings formed in Example 1.
Figure 14:
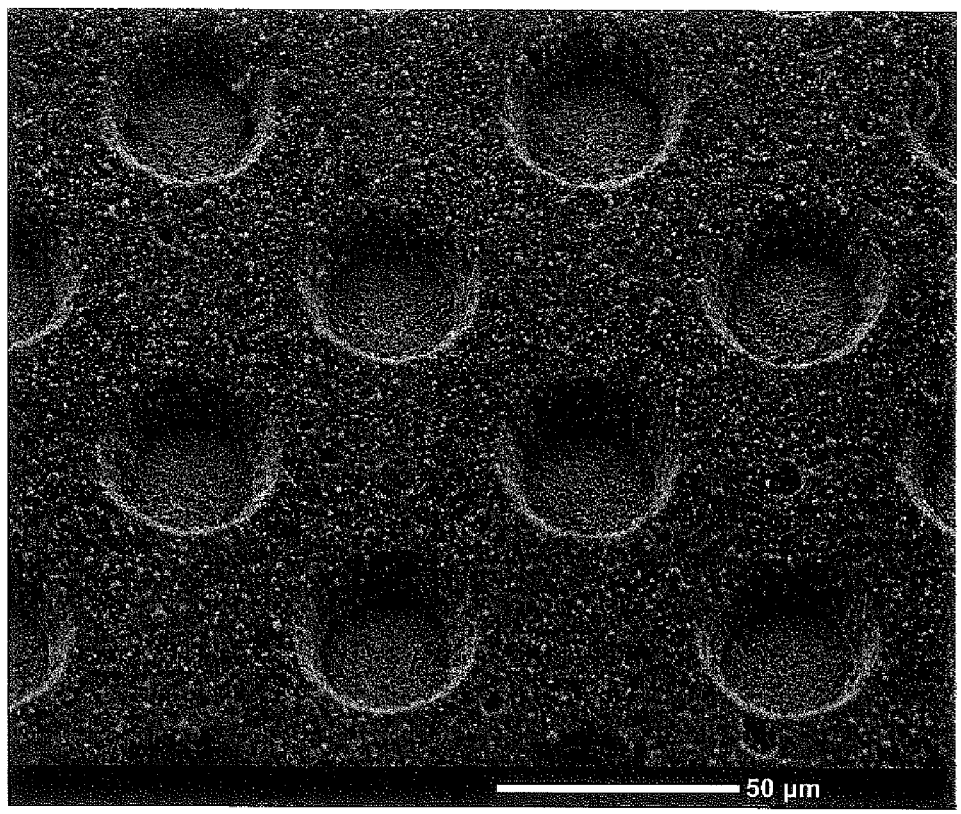
FIG. 14 is an SEM photograph showing openings formed in Example 32.

Further, the printed wiring board 100 according to the present invention is a printed wiring board manufactured using the method for manufacturing a printed wiring board according to this embodiment, and the diameter of the opening 4h included in the heat-curable resin layer 4 is 60 μm or less. According to such a printed wiring board 100, the heat-curable resin layer 4 is caused to have the fine opening 4h and have excellent reliability in comparison with a conventional printed wiring board illustrated in FIG. 12. Further, since the diameter of the opening 4h included in the heat-curable resin layer 4 is 60 μm or less, such a printed wiring board 100 is preferred for mounting the semiconductor element whose number of pins is tens of thousands to hundreds of thousands. Further, in the printed wiring board 100, various processing treatments generally performed on the printed wiring board, such as a nickel/gold plating or soldering process may be performed on the surface wiring pattern.

While the preferred embodiments of the method for manufacturing a printed wiring board and the resin composition according to the present invention have been described, the present invention is not necessarily limited to the embodiments described above and may be appropriately changed without departing from the gist of the present invention.

For example, while the heat-curing process for heat-curing the heat-curable resin layer 4 is included as a process immediately after the heat-curable resin layer formation process in the above-described embodiment, the heat-curing process may be included as a process between the pattern exposure process and the opening formation process or as a process after the opening formation process when removal of a portion of the heat-curable resin layer 4 and removal of the first photosensitive resin layer 3 exposed from the heat-curable resin layer 4 are performed by performing the plasma processing in the pattern exposure process and the opening formation process.

EXAMPLES

Preparation of the Printed Wiring Board Containing a Conductor Circuit

First, a copper-clad laminate 1 (MCL-E-679FG made by Hitachi Chemical Co., Ltd.) in which a copper foil 2 having a thickness of 12 μm was adhered to both surfaces was prepared. The thickness of the copper-clad laminate 1 was 400 μm (see FIG. 1(a)). The copper foil 2 was etched and processed in a predetermined pattern shape (see FIG. 1(b)).

<Formation of the First Photosensitive Resin Layer>

Then, a photosensitive resin composition having a film thickness of 10 μm to 40 μm based on a dry film resist (Photec H-7025 of Hitachi Chemical Co., Ltd.) was prepared as a photosensitive resin composition, adhered on both surfaces using a roll laminator, brought into close contact with a photo tool having a pattern formed therein, and exposed with an energy amount of 50 mJ/cm² using an EXM-1201 type exposure apparatus made by ORC Manufacturing Co. LTD., as illustrated in FIG. 2. Then, spray development was performed for 90 seconds with a 1 mass % sodium carbonate aqueous solution of 30° C., and the photosensitive resin composition was opened to form the patterns 3a and 3b of the first photosensitive resin layer (see FIG. 3).

<Heat-Curable Resin Compositions Used for Formation of the Heat-Curable Resin Layer 4>

Heat-curable resin compositions shown below were prepared as heat-curable resin compositions used for formation of the heat-curable resin layer 4 (interlayer insulating layer) of the printed wiring board.

<Heat-Curable Resin Composition A>

A biphenyl aralkyl type epoxy resin, 70 parts by mass of a product named NC-3000H (made by Nippon Kayaku Co., Ltd.), was used as an epoxy resin. Synthesis Example 1 of a curing agent: bis(4-aminophenyl)sulfone: 26.40 g, 2,2'-bis [4-(4-maleimide phenoxy) phenyl]propane: 484.50 g, p-amino benzoic acid: 29.10 g, and dimethyl acetamide: 360.00 g were put into a reaction container having a capacity of 2 liters capable of being heated and cooled and including a thermometer, a stirring device, and a water metering device with a reflux condenser to react to one another for five hours at 140° C. and to obtain a solution of a curing agent (A-1) having a sulfonic group in a molecular main chain and having an acidic substituent group and an unsaturated N-substituted maleimide group. 30 parts by mass of this curing agent was compounded.

A silica filler having an average particle size of 50 nm and subjected to a silane coupling treatment with vinyl silane was used as an inorganic filler component. Further, the inorganic filler component was compounded to be 30 mass % with respect to a resin. A dispersion state was measured using a dynamic light scattering-type nano-track particle size distribution meter "UPA-EX150" (made by Nikkiso Co., Ltd.) and a laser diffraction scattering type micro track particle size distribution meter "MT-3100" (made by Nikkiso Co., Ltd.), and it was confirmed that the maximum particle size was 1 μm or less.

<Heat-Curable Resin Composition B>

A biphenyl aralkyl type epoxy resin, 70 parts by mass of a product named NC-3000H (made by Nippon Kayaku Co., Ltd.), was used as an epoxy resin. Synthesis Example 2 of the curing agent: 52.7 g of Wandamin HM (WHM) [(4,4'-diamino)dicyclohexyl methane; a brand name used by New Japan Chemical Co. Ltd.] as a diamine compound, 6 g of 3,3'-dihydroxy-4,4'-diaminobiphenyl as a diamine having a reactive functional group, 108 g of trimellitic anhydride (TMA) as a tricarboxylic acid anhydride, and 1281 g of N-methyl-2-pyrrolidone (NMP) as an aprotic polar solvent were put into a flask, an internal temperature of the flask was set to 80° C., and stirring was performed for 30 minutes. After the stirring ended, 192 g of toluene as an azeotropic aromatic hydrocarbon with water were also added, the internal temperature of the flask was increased to 160° C., and reflux was performed for 2.5 hours. A theoretical amount of water was retained in a water metering receiver, it was confirmed that distilling of the water was not seen, and then the internal temperature of the flask was increased to 180° C. while removing the water and the toluene in the water metering receiver to thereby remove the toluene in a reaction solution. After the solution in the flask was cooled to 60° C., 309.5 g of hydrogenated α,ω-polybutadiene dicarboxylic acid (CI-1000, which is a brand name used by Nippon Soda Co., Ltd.) was added as a dicarboxylic acid having a long chain hydrocarbon chain backbone (about 50 carbon atoms) and stirred for ten minutes. After the stirring ended, 119.7 g of 4,4'-diphenyl methane diisocyanate (MDI) was added as a diisocyanate, and an internal temperature of the flask was increased to 160° C. to react for two hours to obtain a resin solution. A weight average molecular weight (Mw) of this polyamide-imide resin solution was measured to be 47,000 by gel permeation chromatography. The number N of average reactive functional groups per one molecule of polyamide-imide was 4.4. 30 parts by mass of this curing agent was compounded. The same composition as in heat-curable resin composition A was used as an inorganic filler component.

<Heat-Curable Resin Composition C>

A prepolymer of bisphenol A dicyanate, 60 parts by weight of a product named BA230S75 (made by Lonza Japan Ltd., a methyl ethyl ketone solution having nonvolatile content of 75 mass %), was used as the cyanate ester resin. A biphenyl aralkyl type epoxy resin, 40 parts by mass of a product named NC-3000H (made by Nippon Kayaku Co., Ltd.), was used as the epoxy resin, and cobalt(II) acetylacetonate (made by Tokyo Kasei Co., Ltd.) was added to be 30 ppm as the curing catalyst. The same composition as in the heat-curable resin composition A was used as the inorganic filler component.

<Heat-Curable Resin Composition D>

A cresol novolac type epoxy resin, 70 parts by mass of a product named Epiclon N660 (made by DIC Corporation), was used as an epoxy resin. A phenoxy resin YP-55 (made by Nippon Steel Chemical Co., Ltd.), 30 parts by mass of a melamine-modified phenolic novolac resin LA7054 (made by DIC Corporation), was used as the curing agent. As an inorganic filler component, barium sulfate having an average particle size of 300 nm was dispersed and adjusted for three hours at circumferential speed of 12 m/s using zirconia beads having a diameter of 1.0 mm in a Star Mil LMZ (made by Ashizawa Finetech Inc.). The dispersion state was measured using the same method as in the resin A and it was confirmed that the maximum particle size was 2 μm.

The solution of each heat-curable resin composition obtained as described above was uniformly applied on the polyethylene terephthalate film (G2-16, which is brand name used by Teijin Limited) having a thickness of 16 μm, which is a support layer, to form a heat-curable resin composition layer. Then, the heat-curable resin composition layer was dried for about ten minutes at 100° C. using a hot air convection-type dryer to obtain a film-shaped heat-curable resin composition. The film-shaped heat-curable resin composition having a film thickness of 10 μm to 90 μm was prepared.

Then, a polyethylene film (NF-15, which is a brand name used by Tamapoly Co., Ltd.) was bonded as a protection film on a surface on the opposite side from the side in contact with the support layer so that dust did not attach to the heat-curable resin composition layer, to thereby obtain a heat-curable film type resin composition.

The heat-curable resin layer 4 was formed on the printed wiring board using the obtained heat-curable film type resin composition (see FIG. 4). Specifically, first, only the protection film of the heat-curable film type resin composition including heat-curable resin composition A, B, C or D was peeled, and the heat-curable resin composition was placed on both surfaces (the first photosensitive resin layer patterns 3a and 3b and the conductor circuits 2a and 2b) of the printed wiring board 10. The heat-curable resin composition was laminated on the surface of the printed wiring board using a press-type vacuum laminator (MVLP-500, which is a brand name used by MEIKI Co., Ltd.). Press conditions were that a press hot plate temperature was 80° C., an evacuation time was 20 seconds, a laminate press time was 30 seconds, an atmospheric pressure was 4 kPa or less, and a crimping pressure was 0.4 MPa. Then, the heat-curable resin layer 4 was heat-cured during a predetermined time at a predetermined temperature in a clean oven.

Figure 5:
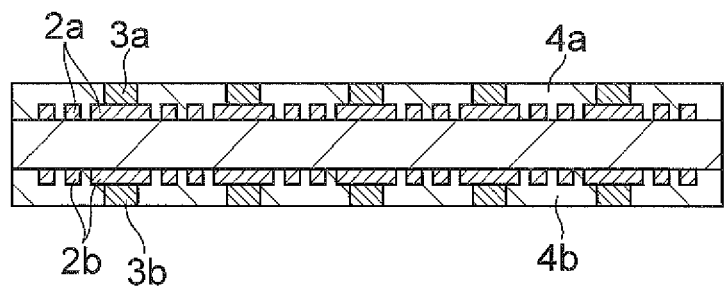
FIG. 5 is a cross-sectional view illustrating a pattern exposure process subsequent to FIG. 4.

Then, a removal process was performed according to a process shown in Table 1 to grind the heat-curable resin layer 4 and expose the patterns 3a and 3b of the first photosensitive resin layer, and the patterns 3a and 3b of the first photosensitive resin layer were removed to open a portion of the heat-curable resin layer 4 (see FIGS. 5 and 6). Further, the removal process (desmearing process or plasma processing) was repeatedly performed, as necessary. An opening formation process condition at the time of manufacture of the printed wiring board in the example is shown in Table 2 and 3.

TABLE 1

| Process | Processing liquid, apparatus | Conditions |
|---|---|---|
| Swelling | Swelling Dip Securiganth P made by ATOTECH Co., Ltd. | 80° C., 5 min |
| Water washing | Flowing water | Room temperature, 2 min |
| Roughening | Concentrate Compact CP made by ATOTECH Co., Ltd. | 80° C., 30 min |
| Dragging out | Water | 50° C., 2 min |
| Neutralizing | Reduction Solution Securiganth P500 made by ATOTECH Co., Ltd. | 40° C., 5 min |
| Water washing | Flowing water | Room temperature, 5 min |
| Drying | Dried with oven after blowing | 80° C., 5 min |

TABLE 2

| Opening forming process conditions | Example 1 | Example 2 | Example 3 | Example 4 | Example 5 | Example 6 | Example 7 | Example 8 |
|---|---|---|---|---|---|---|---|---|
| Photosensitive resin composition | H-7025 | H-7025 | H-7025 | H-7025 | H-7025 | H-7025 | H-7025 | H-7026 |
| $T_1$ (μm) | 20 | 20 | 40 | 20 | 20 | 10 | 10 | 15 |
| Exposure amount (mJ/cm$^2$) | 50 | 50 | 50 | 50 | 50 | 50 | 50 | 50 |
| Developing time (sec) | 90 | 90 | 90 | 90 | 90 | 90 | 90 | 90 |
| Heat-curable resin composition | A | A | A | B | C | A | A | A |
| $T_2$ (μm) | 22 | 24 | 42 | 22 | 22 | 12 | 12 | 17 |
| Laminate temperature (° C.) | 80 | 80 | 80 | 80 | 80 | 80 | 80 | 80 |
| Heat-curing temperature (° C.) | 160 | 160 | 160 | 160 | 160 | 250 | 160 | 180 |
| Heat-curing time (min) | 60 | 60 | 60 | 60 | 60 | 30 | 300 | 60 |
| Atmosphere during curing | air | air | air | air | air | nitrogen | nitrogen | air |
| Number of desmearing processes | 1 | 2 | 1 | 1 | 1 | 1 | 1 | 1 |
| $T_2/T_1$ | 1.10 | 1.20 | 1.05 | 1.10 | 1.10 | 1.20 | 1.20 | 1.13 |

TABLE 3

| Opening forming process conditions | Example 9 | Example 10 | Example 11 | Example 12 | Example 13 | Example 14 | Example 15 |
|---|---|---|---|---|---|---|---|
| Photosensitive resin composition | H-7025 | H-7025 | H-7025 | H-7025 | H-7025 | H-7025 | H-7025 |
| $T_1$ (μm) | 15 | 15 | 15 | 15 | 15 | 20 | 20 |
| Exposure amount (mJ/cm$^2$) | 50 | 50 | 50 | 50 | 50 | 50 | 50 |
| Developing time (sec) | 90 | 90 | 90 | 90 | 90 | 90 | 90 |
| Heat-curable resin composition | A | A | A | A | A | A | D |
| $T_2$ (μm) | 17 | 17 | 17 | 19 | 17 | 42 | 22 |
| Laminate temperature (° C.) | 80 | 80 | 80 | 80 | 80 | 80 | 80 |
| Heat-curing temperature (° C.) | 180 | 200 | 220 | 180 | 180 | 160 | 160 |
| Heat-curing time (min) | 120 | 60 | 60 | 60 | 60 | 60 | 60 |

TABLE 3-continued

| Opening forming process conditions | Example 9 | Example 10 | Example 11 | Example 12 | Example 13 | Example 14 | Example 15 |
|---|---|---|---|---|---|---|---|
| Atmosphere during curing | air | air | nitrogen | air | air | air | Air |
| Number of desmearing processes | 1 | 1 | 1 | 2 | 1 | 4 | 1 |
| $T_2/T_1$ | 1.13 | 1.13 | 1.13 | 1.27 | 1.13 | 2.10 | 1.10 |

Then, the seed layer 5 having a thickness of 1 μm was formed using the electroless copper plating method to cover the heat-curable resin layer 4, as illustrated in FIG. 7. Then, the dry film resist 6 (Photec RY-3525, Hitachi Chemical Co., Ltd.) was adhered as a second photosensitive resin composition on both surfaces using a roll laminator, a photo tool having a pattern formed therein was brought into close contact, and exposure was performed with an energy amount of 100 mJ/cm$^2$ using an EXM-1201 type exposure apparatus made by ORC Manufacturing Co. Ltd, as illustrated in FIG. 8. Then, spray development was performed for 90 seconds with 1 wt % of a sodium carbonate aqueous solution of 30° C., and the dry film resist 6 was opened (patterns 6a and 6b of the second photosensitive resin layer). Then, as illustrated in FIG. 8, copper plating (wiring portion 7) having a thickness of 10 μm was formed to cover at least a portion of the seed layer 5 using the electrolysis copper plating method (see FIG. 9). Then, as illustrated in FIG. 9, the patterns 6a and 6b of the second photosensitive resin layer were peeled using a peeling solution to form wiring patterns 7a and 7b. Then, the seed layer 5 was removed using an etching liquid (see FIG. 10). This process was repeated on front and back surfaces three times to form a solder-resist 8 on the outermost layer, and then a plating process was performed so that a nickel plating thickness was 5 μm and a gold plating thickness was 0.1 μm using a commercially available electroless nickel/gold plating liquid to thereby form the nickel/gold layer 9. Thus, the multilayer printed wiring board 200 was obtained (see FIG. 11).

In the multilayer printed wiring board 200, a board size was 45 mm×45 mm, and respective openings having diameters of 30 μm, 50 μm, 70 μm and 90 μm were provided in an area array form in a range of a central portion of 20 mm×20 mm.

A property of embedment in the heat-curable resin layer was evaluated based on the following criteria.
A: Embedment without a gap is particularly good.
C: Embedment into the opening is good.

Chemical resistance of the heat-curable resin layer was evaluated through visual confirmation based on the following criteria. The removal process is plasma processing or a desmearing process in the exposure process and the opening formation process.

A: The heat-curable resin layer is not peeled after the removal process.
C: Peeling of the heat-curable resin layer is confirmed after removal process, but there is no problem in manufacturing the printed wiring board.

Resolution (an opening property) was observed using an electron microscope (SEM) and evaluated based on the following criteria.
AA: An opening can be formed with a diameter of 30 μm or less.
A: An opening can be formed with a diameter of 50 μm or less.
B: An opening can be formed with a diameter of 70 μm or less.
C: An opening can be formed with a diameter of 90 μm or less.

Wall surface smoothness of the opening was confirmed using an electron microscope and evaluated based on the following criteria.
A: The wall surface is smooth.
C: Lack of or a step in the filler in the wall surface is confirmed, but there is no problem in manufacturing the printed wiring board.

A residue removal property of the opening was evaluated based on the following criteria.
A: Residue of the dry film resist in the copper surface is absent or can be peeled or removed.
C: The residue of the dry film resist is confirmed, but there is no problem in manufacturing the printed wiring board.

The electroless copper plating property was evaluated based on the following criteria.
A: An entire surface is smoothly plated.
C: Plating irregularity is confirmed on the copper surface of the opening, but there is no problem in manufacturing the printed wiring board.

Results are shown in Tables 4 and 5. This process is not limited to the interlayer connection of the printed wiring board, and may be applied to a process of providing a fine, high-density opening portion, including a process of opening the solder-resist or a process of rewiring a wafer level package.

TABLE 4

| Evaluation result | Example 1 | Example 2 | Example 3 | Example 4 | Example 5 | Example 6 | Example 7 | Example 8 |
|---|---|---|---|---|---|---|---|---|
| Burying property | A | A | A | A | A | A | A | A |
| Chemical resistance property | A | A | A | A | A | A | A | A |
| Roughening time (min) | 30 | 60 | 30 | 30 | 30 | 30 | 30 | 30 |
| Height of opening portion (μm) | 20 | 20 | 40 | 20 | 10 | 10 | 10 | 10 |
| Resolution property | AA | AA | A | AA | AA | AA | AA | AA |
| Wall surface smoothness | A | A | A | A | A | A | A | A |
| Residue removal property | A | A | A | A | A | A | A | A |
| Electroless copper plating | A | A | A | A | A | A | A | A |

TABLE 5

| Evaluation result | Example 9 | Example 10 | Example 11 | Example 12 | Example 13 | Example 14 | Example 15 |
|---|---|---|---|---|---|---|---|
| Burying property | A | A | A | A | A | A | A |
| Chemical resistance property | A | A | A | A | A | A | A |
| Roughening time (min) | 30 | 30 | 30 | 60 | 30 | 120 | 30 |
| Height of opening portion (μm) | 10 | 10 | 10 | 10 | 10 | 20 | 20 |
| Resolution property | AA | AA | AA | AA | AA | AA | AA |
| Wall surface smoothness | A | A | A | A | A | A | C |
| Residue removal property | A | A | A | A | A | A | A |
| Electroless copper plating | A | A | A | A | A | A | A |

Similar evaluation was performed when the openings were formed using plasma processing. A plasma processing apparatus (PB-1000S; Mory Engineering Co., Ltd.) was used for plasma processing. The plasma processing was performed using both oxygen gas and argon gas according to conditions show in Table 6, and washing with water was performed in each process of 15 minutes (ultrasonic cleaning: 100 Hz, 5 min). By performing plasma processing, a portion of the heat-curable resin layer 4 was removed to expose the patterns 3a and 3b of the first photosensitive resin layer, and the patterns 3a and 3b of the first photosensitive resin layer were removed to open a portion of the heat-curable resin layer 4 (see FIGS. 5 and 6). Further, the plasma processing was repeatedly performed as necessary. Opening formation process conditions at the time of manufacture of the printed wiring board in the example are shown in Tables 7 and 8. Further, in Example 31, heat curing of the heat-curable resin layer 4 was not performed.

TABLE 6

| Process | Conditions |
|---|---|
| Gas 1 | Oxygen, 160 mL/min |
| Gas 2 | Argon, 25 mL/min |
| Output | 500 w |
| Time | 15 min |

TABLE 7

| Opening forming process conditions | Example 16 | Example 17 | Example 18 | Example 19 | Example 20 | Example 21 | Example 22 | Example 23 |
|---|---|---|---|---|---|---|---|---|
| Photosensitive resin composition | H-7025 | H-7025 | H-7025 | H-7025 | H-7025 | H-7025 | H-7025 | H-7026 |
| $T_1$ (μm) | 20 | 20 | 40 | 20 | 20 | 10 | 10 | 15 |
| Exposure amount (mJ/cm$^2$) | 50 | 50 | 50 | 50 | 50 | 50 | 50 | 50 |
| Developing time (sec) | 90 | 90 | 90 | 90 | 90 | 90 | 90 | 90 |
| Heat-curable resin composition | A | A | A | B | C | A | A | A |
| $T_2$ (μm) | 22 | 24 | 42 | 22 | 22 | 12 | 12 | 17 |
| Laminate temperature (° C.) | 80 | 80 | 80 | 80 | 80 | 80 | 80 | 80 |
| Heat-curing temperature (° C.) | 160 | 160 | 160 | 160 | 160 | 250 | 160 | 180 |
| Heat-curing time (min) | 60 | 60 | 60 | 60 | 60 | 30 | 300 | 60 |
| Atmosphere during curing | air | air | air | air | air | nitrogen | nitrogen | air |
| Number of plasma processes | 8 | 9 | 12 | 8 | 8 | 4 | 4 | 6 |
| $T_2/T_1$ | 1.10 | 1.20 | 1.05 | 1.10 | 1.10 | 1.20 | 1.20 | 1.13 |

TABLE 8

| Opening forming process conditions | Example 24 | Example 25 | Example 26 | Example 27 | Example 28 | Example 29 | Example 30 | Example 31 |
|---|---|---|---|---|---|---|---|---|
| Photosensitive resin composition | H-7025 | H-7025 | H-7025 | H-7025 | H-7025 | H-7025 | H-7025 | H-7026 |
| $T_1$ (μm) | 15 | 15 | 15 | 15 | 15 | 20 | 20 | 20 |
| Exposure amount (mJ/cm$^2$) | 50 | 50 | 50 | 50 | 50 | 50 | 50 | 50 |
| Developing time (sec) | 90 | 90 | 90 | 90 | 90 | 90 | 90 | 90 |
| Heat-curable resin composition | A | A | A | A | A | A | D | A |
| $T_2$ (μm) | 17 | 17 | 17 | 19 | 17 | 42 | 22 | 22 |
| Laminate temperature (° C.) | 80 | 80 | 80 | 80 | 80 | 80 | 80 | 80 |
| Heat-curing temperature (° C.) | 180 | 200 | 220 | 180 | 180 | 160 | 160 | — |
| Heat-curing time (min) | 120 | 60 | 60 | 60 | 60 | 60 | 300 | — |
| Atmosphere during curing | air | air | nitrogen | air | air | air | air | air |
| Number of plasma processes | 6 | 6 | 6 | 7 | 6 | 16 | 8 | 5 |
| $T_2/T_1$ | 1.13 | 1.13 | 1.13 | 1.27 | 1.13 | 2.10 | 1.10 | 1.10 |

Then, the printed wiring board was prepared using the same method as that in Examples 1 to 15, and a burying property, a resolution property, wall surface smoothness, a residue removal property, an electroless copper plating property were evaluated. Results are shown in Tables 9 and 10.

portion of the heat-curable resin layer 4 was removed by performing the plasma processing to expose the patterns 3a and 3b of the first photosensitive resin layer, and then the patterns 3a and 3b of the first photosensitive resin layer were removed by performing the desmearing process to expose

TABLE 9

| Evaluation result | Example 16 | Example 17 | Example 18 | Example 19 | Example 20 | Example 21 | Example 22 | Example 23 |
|---|---|---|---|---|---|---|---|---|
| Burying property | A | A | A | A | A | A | A | A |
| Plasma time (min) | 120 | 135 | 180 | 120 | 120 | 60 | 60 | 90 |
| Height of opening portion (μm) | 14 | 14 | 28 | 14 | 14 | 7 | 7 | 7 |
| Resolution property | AA | AA | A | AA | AA | AA | AA | AA |
| Wall surface smoothness | A | A | A | A | A | A | A | A |
| Residue removal property | A | A | A | A | A | A | A | A |
| Electroless copper plating | A | A | A | A | A | A | A | A |

TABLE 10

| Evaluation result | Example 24 | Example 25 | Example 26 | Example 27 | Example 28 | Example 29 | Example 30 | Example 31 |
|---|---|---|---|---|---|---|---|---|
| Burying property | A | A | A | A | A | A | A | A |
| Plasma time (min) | 90 | 90 | 90 | 105 | 90 | 240 | 75 | 75 |
| Height of opening portion (μm) | 7 | 7 | 7 | 7 | 7 | 14 | 14 | 10 |
| Resolution property | AA | AA | AA | AA | AA | AA | AA | A |
| Wall surface smoothness | A | A | A | A | A | A | C | A |
| Residue removal property | A | A | A | A | A | A | A | A |
| Electroless copper plating | A | A | A | A | A | A | A | A |

A case in which both the plasma processing and the desmearing process were used to form the openings was similarly evaluated. Conditions of the plasma processing were similar to those in Table 6. Washing with water (ultrasonic cleaning: five minutes at 100 Hz) was performed after the plasma processing. For the conditions of the desmearing process, only a desmearing roughening time of Table 1 was changed from 30 minutes to 15 minutes. A the conductor circuits 2a and 2b and form the opening 4h in the heat-curable resin layer 4 (see FIGS. 5 and 6). Further, the plasma processing and the desmearing process were repeatedly performed as necessary. Opening formation process conditions at the time of manufacturing the printed wiring board in the example are shown in Tables 11 and 12.

TABLE 11

| Opening forming process conditions | Example 32 | Example 33 | Example 34 | Example 35 | Example 36 | Example 37 | Example 38 | Example 39 |
|---|---|---|---|---|---|---|---|---|
| Photosensitive resin composition | H-7025 | H-7025 | H-7025 | H-7025 | H-7025 | H-7025 | H-7025 | H-7026 |
| $T_1$ (μm) | 20 | 20 | 40 | 20 | 20 | 10 | 10 | 15 |
| Exposure amount (mJ/cm$^2$) | 50 | 50 | 50 | 50 | 50 | 50 | 50 | 50 |
| Developing time (sec) | 90 | 90 | 90 | 90 | 90 | 90 | 90 | 90 |
| Heat-curable resin composition | A | A | A | B | C | A | A | A |
| $T_2$ (μm) | 22 | 24 | 42 | 22 | 22 | 12 | 12 | 17 |
| Laminate temperature (° C.) | 80 | 80 | 80 | 80 | 80 | 80 | 80 | 80 |
| Heat-curing temperature (° C.) | 160 | 160 | 160 | 160 | 160 | 250 | 160 | 180 |
| Heat-curing time (min) | 60 | 60 | 60 | 60 | 60 | 30 | 300 | 60 |
| Atmosphere during curing | air | air | air | air | air | nitrogen | nitrogen | air |
| Number of plasma processes | 1 | 2 | 1 | 1 | 1 | 1 | 1 | 1 |
| Number of desmearing processes | 1 | 1 | 1 | 1 | 1 | 1 | 1 | 1 |
| $T_2/T_1$ | 1.10 | 1.20 | 1.05 | 1.10 | 1.10 | 1.20 | 1.20 | 1.13 |

TABLE 12

| Opening forming process conditions | Example 40 | Example 41 | Example 42 | Example 43 | Example 44 | Example 45 | Example 46 |
|---|---|---|---|---|---|---|---|
| Photosensitive resin composition | H-7025 | H-7025 | H-7025 | H-7025 | H-7025 | H-7025 | H-7025 |
| $T_1$ (μm) | 15 | 15 | 15 | 15 | 15 | 20 | 20 |
| Exposure amount (mJ/cm$^2$) | 50 | 50 | 50 | 50 | 50 | 50 | 50 |
| Developing time (sec) | 90 | 90 | 90 | 90 | 90 | 90 | 90 |
| Heat-curable resin composition | A | A | A | A | A | A | D |
| $T_2$ (μm) | 17 | 17 | 17 | 19 | 17 | 42 | 22 |
| Laminate temperature (° C.) | 80 | 80 | 80 | 80 | 80 | 80 | 80 |

TABLE 12-continued

| Opening forming process conditions | Example 40 | Example 41 | Example 42 | Example 43 | Example 44 | Example 45 | Example 46 |
|---|---|---|---|---|---|---|---|
| Heat-curing temperature (° C.) | 180 | 200 | 220 | 180 | 180 | 160 | 160 |
| Heat-curing time (min) | 120 | 60 | 60 | 60 | 60 | 60 | 60 |
| Atmosphere during curing | air | air | nitrogen | air | air | air | air |
| Number of plasma processes | 1 | 1 | 1 | 2 | 1 | 7 | 1 |
| Number of desmearing processes | 1 | 1 | 1 | 1 | 1 | 1 | 1 |
| $T_2/T_1$ | 1.13 | 1.13 | 1.13 | 1.27 | 1.13 | 2.10 | 1.10 |

Then, the printed wiring board was prepared using the same method as that in Examples 1 to 15, and a burying property, a chemical resistance property, a resolution property, wall surface smoothness, a residue removal property, and an electroless copper plating property were evaluated. Results are shown in Tables 13 and 14.

TABLE 13

| Evaluation result | Example 32 | Example 33 | Example 34 | Example 35 | Example 36 | Example 37 | Example 38 | Example 39 |
|---|---|---|---|---|---|---|---|---|
| Burying property | A | A | A | A | A | A | A | A |
| Chemical resistance property | A | A | A | A | A | A | A | A |
| Plasma time (min) | 15 | 30 | 15 | 15 | 15 | 15 | 15 | 15 |
| Desmearing roughening time (min) | 15 | 15 | 15 | 15 | 15 | 15 | 15 | 15 |
| Height of opening portion (μm) | 20 | 20 | 40 | 20 | 10 | 10 | 10 | 10 |
| Resolution property | AA | AA | A | AA | AA | AA | AA | AA |
| Wall surface smoothness | A | A | A | A | A | A | A | A |
| Residue removal property | A | A | A | A | A | A | A | A |
| Electroless copper plating | A | A | A | A | A | A | A | A |

TABLE 14

| Evaluation result | Example 40 | Example 41 | Example 42 | Example 43 | Example 44 | Example 45 | Example 46 |
|---|---|---|---|---|---|---|---|
| Burying property | A | A | A | A | A | A | A |
| Chemical resistance property | A | A | A | A | A | A | A |
| Plasma time (min) | 15 | 15 | 15 | 30 | 15 | 105 | 15 |
| Desmearing roughening time (min) | 15 | 15 | 15 | 15 | 15 | 15 | 15 |
| Height of opening portion (μm) | 10 | 10 | 10 | 10 | 10 | 20 | 20 |
| Resolution property | AA | AA | AA | AA | AA | AA | AA |
| Wall surface smoothness | A | A | A | A | A | A | C |
| Residue removal property | A | A | A | A | A | A | A |
| Electroless copper plating | A | A | A | A | A | A | A |

REFERENCE SIGNS LIST

1 . . . Copper-clad laminate, 2a, 2b . . . Conductor circuit (copper foil), 3 . . . First photosensitive resin layer, 3a, 3b . . . Pattern of first photosensitive resin layer, 4 . . . Heat-curable resin layer, 4h . . . Opening, 5 . . . Seed layer, 6a, 6b . . . Pattern of second photosensitive resin layer, 7 . . . Wiring portion, 7a, 7b . . . Wiring pattern, 8 . . . Solder-resist, 9 . . . Nickel/gold layer, 10 . . . Printed wiring board (inner layer board), 100 . . . Multilayer printed wiring board, 200 . . . Multilayer printed wiring board having solder-resist and nickel/gold layer

The invention claimed is:

1. A method for manufacturing a structure containing a conductor circuit on a surface of a support and a heat-curable resin layer as an insulating layer having at least one opening through which the conductor circuit is exposed so that a wiring portion may be formed in the opening connected to the conductor circuit, the method comprising:

a first photosensitive resin layer formation process for forming a first photosensitive resin layer to cover the conductor circuit on the support;

a first patterning process for patterning the first photosensitive resin layer by performing an exposure process and a developing process on the first photosensitive resin layer;

a heat-curable resin layer formation process for forming a heat-curable resin layer on the support to cover the pattern of the first photosensitive resin layer;

a heat-curing process for heat-curing the heat-curable resin layer as a process immediately after the heat-curable resin layer formation process, a material removal process for removing a portion of the heat-curable resin layer to expose a predetermined place of the pattern of the first photosensitive resin layer from the heat-curable resin layer, wherein the material removal process comprises performing removal of a portion of the heat-curable resin layer after the heat curing by performing plasma processing; and an opening formation process for removing the first photosensitive resin layer exposed from the heat-curable resin layer by a desmearing process to form an opening through the heat-curable resin layer exposing the conductor circuit.

2. The method for manufacturing a structure containing a conductor circuit according to claim 1, wherein a temperature of the heat-curable resin layer ranges from 150° C. to 250° C. and a heating time ranges from 30 minutes to 300 minutes in the heat-curing process.

3. The method for manufacturing a structure containing a conductor circuit according to claim 1, wherein the heat-curing process includes performing heat curing in an atmosphere of an inert gas.

4. The method for manufacturing a structure containing a conductor circuit according to claim 1, further comprising:
a seed layer formation process for forming a seed layer which is a base of the wiring portion using an electroless plating method to cover at least a portion of the heat-curable resin layer after the opening is formed;
a second patterning process for forming a second photosensitive resin layer to cover the seed layer and then performing an exposure process and a developing process on the second photosensitive resin layer to pattern the second photosensitive resin layer to form a patterned second photosensitive resin layer;
a wiring portion patterning process for forming the wiring portion using an electrolytic plating method to cover at least a portion of the seed layer other than areas covered by the patterned second photosensitive resin layer and then peeling the patterned second photosensitive resin layer using a peeling process to pattern the wiring portion; and
a seed layer removal process for removing the seed layer in an area in which the wiring portion is not formed.

5. The method for manufacturing a structure containing a conductor circuit according to claim 1, wherein a thickness $T_1$ of the first photosensitive resin layer ranges from 2 µm to 50 µm in the first photosensitive resin layer formation process.

6. The method for manufacturing a structure containing a conductor circuit according to claim 1, wherein a thickness $T_2$ of the heat-curable resin layer ranges from 2 µm to 50 µm in the heat-curable resin layer formation process.

7. The method for manufacturing a structure containing a conductor circuit according to claim 1, wherein a ratio $(T_2/T_1)$ of a thickness $T_2$ of the heat-curable resin layer to a thickness $T_1$ of the first photosensitive resin layer ranges from 1.0 to 2.0 in the heat-curable resin layer formation process.

8. The method for manufacturing a structure containing a conductor circuit according to claim 1, wherein the opening formation process forms a plurality of openings through the heat-curable resin layer, and a ratio $(D/R_{min})$ of a depth D of the openings to a diameter $R_{min}$ of a smallest diameter opening among the openings formed in the heat-curable resin layer ranges from 0.1 to 1.0 in the opening formation process.

9. A method for manufacturing a structure containing a conductor circuit on a surface of a support and a heat-curable resin layer as an insulating layer having at least one opening through which the conductor circuit is exposed so that a wiring portion may be formed in the opening connected to the conductor circuit, the method comprising:
a first photosensitive resin layer formation process for forming a first photosensitive resin layer to cover the conductor circuit on the support;
a first patterning process for patterning the first photosensitive resin layer by performing an exposure process and a developing process on the first photosensitive resin layer;
a heat-curable resin layer formation process for forming a heat-curable resin layer on the support to cover the pattern of the first photosensitive resin layer;
a heat-curing process for heat-curing the heat-curable resin layer as a process immediately after the heat-curable resin layer formation process;
a material removal process for removing a portion of the heat-curable resin layer to expose a predetermined place of the pattern of the first photosensitive resin layer from the heat-curable resin layer, wherein the material removal process comprises performing removal of a portion of the heat-curable resin layer after the heat curing by a desmearing process; and
an opening formation process for removing the first photosensitive resin layer exposed from the heat-curable resin layer by a desmearing process to form an opening through the heat-curable resin layer exposing the conductor circuit.

10. The method for manufacturing a structure containing a conductor circuit according to claim 9, wherein a temperature of the heat-curable resin layer ranges from 150° C. to 250° C. and a heating time ranges from 30 minutes to 300 minutes in the heat-curing process.

11. The method for manufacturing a structure containing a conductor circuit according to claim 9, wherein the heat-curing process includes performing heat curing in an atmosphere of an inert gas.

12. The method for manufacturing a structure containing a conductor circuit according to claim 9, further comprising:
a seed layer formation process for forming a seed layer which is a base of the wiring portion using an electroless plating method to cover at least a portion of the heat-curable resin layer after the opening is formed;
a second patterning process for forming a second photosensitive resin layer to cover the seed layer and then performing an exposure process and a developing process on the second photosensitive resin layer to pattern the second photosensitive resin layer to form a patterned second photosensitive resin layer;
a wiring portion patterning process for forming the wiring portion using an electrolytic plating method to cover at least a portion of the seed layer other than areas covered by the patterned second photosensitive resin layer and then peeling the patterned second photosensitive resin layer using a peeling process to pattern the wiring portion; and
a seed layer removal process for removing the seed layer in an area in which the wiring portion is not formed.

13. The method for manufacturing a structure containing a conductor circuit according to claim 9, wherein a thickness $T_1$ of the first photosensitive resin layer ranges from 2 µm to 50 µm in the first photosensitive resin layer formation process.

14. The method for manufacturing a structure containing a conductor circuit according to claim 9, wherein a thickness $T_2$ of the heat-curable resin layer ranges from 2 µm to 50 µm in the heat-curable resin layer formation process.

15. The method for manufacturing a structure containing a conductor circuit according to claim 9, wherein a ratio $(T_2/T_1)$ of a thickness $T_2$ of the heat-curable resin layer to a thickness $T_1$ of the first photosensitive resin layer ranges from 1.0 to 2.0 in the heat-curable resin layer formation process.

16. The method for manufacturing a structure containing a conductor circuit according to claim 9, wherein the opening formation process forms a plurality of openings through the heat-curable resin layer, and a ratio ($D/R_{min}$) of a depth D of the openings to a diameter $R_{min}$ of a smallest diameter opening among the openings formed in the heat-curable resin layer ranges from 0.1 to 1.0 in the opening formation process.

17. A method for manufacturing a structure containing a conductor circuit on a surface of a support and a heat-curable resin layer as an insulating layer having at least one opening through which the conductor circuit is exposed so that a wiring portion may be formed in the opening connected to the conductor circuit, the method comprising:
  a first photosensitive resin layer formation process for forming a first photosensitive resin layer to cover the conductor circuit on the support;
  a first patterning process for patterning the first photosensitive resin layer by performing an exposure process and a developing process on the first photosensitive resin layer;
  a heat-curable resin layer formation process for forming a heat-curable resin layer on the support to cover the pattern of the first photosensitive resin layer;
  a heat-curing process for heat-curing the heat-curable resin layer as a process immediately after the heat-curable resin layer formation process;
  a material removal process for removing a portion of the heat-curable resin layer to expose a predetermined place of the pattern of the first photosensitive resin layer from the heat-curable resin layer, wherein the material removal process includes performing removal of a portion of the heat-curable resin layer after the heat curing by performing a polishing process; and
  an opening formation process for removing the first photosensitive resin layer exposed from the heat-curable resin layer by a desmearing process to form an opening through the heat-curable resin layer exposing the conductor circuit.

18. The method for manufacturing a structure containing a conductor circuit according to claim 17, wherein a temperature of the heat-curable resin layer ranges from 150° C. to 250° C. and a heating time ranges from 30 minutes to 300 minutes in the heat-curing process.

19. The method for manufacturing a structure containing a conductor circuit according to claim 17, wherein the heat-curing process includes performing heat curing in an atmosphere of an inert gas.

20. The method for manufacturing a structure containing a conductor circuit according to claim 17, further comprising:
  a seed layer formation process for forming a seed layer which is a base of the wiring portion using an electroless plating method to cover at least a portion of the heat-curable resin layer after the opening is formed;
  a second patterning process for forming a second photosensitive resin layer to cover the seed layer and then performing an exposure process and a developing process on the second photosensitive resin layer to pattern the second photosensitive resin layer to form a patterned second photosensitive resin layer;
  a wiring portion patterning process for forming the wiring portion using an electrolytic plating method to cover at least a portion of the seed layer other than areas covered by the patterned second photosensitive resin layer and then peeling the patterned second photosensitive resin layer using a peeling process to pattern the wiring portion; and
  a seed layer removal process for removing the seed layer in an area in which the wiring portion is not formed.

21. The method for manufacturing a structure containing a conductor circuit according to claim 17, wherein a thickness $T_1$ of the first photosensitive resin layer ranges from 2 µm to 50 µm in the first photosensitive resin layer formation process.

22. The method for manufacturing a structure containing a conductor circuit according to claim 17, wherein a thickness $T_2$ of the heat-curable resin layer ranges from 2 µm to 50 µm in the heat-curable resin layer formation process.

23. The method for manufacturing a structure containing a conductor circuit according to claim 17, wherein a ratio ($T_2/T_1$) of a thickness $T_2$ of the heat-curable resin layer to a thickness $T_1$ of the first photosensitive resin layer ranges from 1.0 to 2.0 in the heat-curable resin layer formation process.

24. The method for manufacturing a structure containing a conductor circuit according to claim 17, wherein the opening formation process forms a plurality of openings through the heat-curable resin layer, and a ratio ($D/R_{min}$) of a depth D of the openings to a diameter $R_{min}$ of a smallest diameter opening among the openings formed in the heat-curable resin layer ranges from 0.1 to 1.0 in the opening formation process.

* * * * *